(12) United States Patent
Montilla et al.

(10) Patent No.: US 11,016,396 B2
(45) Date of Patent: May 25, 2021

(54) METHOD, SUBSTRATE AND APPARATUS TO MEASURE PERFORMANCE OF OPTICAL METROLOGY

(71) Applicant: ASML Holding N.V., Veldhoven (NL)

(72) Inventors: Leonardo Gabriel Montilla, Norwalk, CT (US); Krishanu Shome, Cheshire, CT (US)

(73) Assignee: ASML Holding N.V, Veldhoven (NL)

( * ) Notice: Subject to any disclaimer, the term of this patent is extended or adjusted under 35 U.S.C. 154(b) by 0 days.

(21) Appl. No.: 16/610,798

(22) PCT Filed: Apr. 17, 2018

(86) PCT No.: PCT/EP2018/059699
§ 371 (c)(1),
(2) Date: Nov. 4, 2019

(87) PCT Pub. No.: WO2018/202414
PCT Pub. Date: Nov. 8, 2018

(65) Prior Publication Data
US 2020/0073255 A1 Mar. 5, 2020

Related U.S. Application Data

(60) Provisional application No. 62/501,515, filed on May 4, 2017.

(51) Int. Cl.
*G03F 7/20* (2006.01)
(52) U.S. Cl.
CPC ...... *G03F 7/70516* (2013.01); *G03F 7/70608* (2013.01)

(58) Field of Classification Search
CPC .............. G03F 7/70516; G03F 7/70608
See application file for complete search history.

(56) References Cited

U.S. PATENT DOCUMENTS

| 5,607,800 A | 3/1997 | Ziger |
| 5,835,225 A | 11/1998 | Thakur |

(Continued)

FOREIGN PATENT DOCUMENTS

| CN | 1628382 A | 6/2005 |
| CN | 1947062 | 4/2007 |

(Continued)

OTHER PUBLICATIONS

International Search Report and Written Opinion of the International Searching Authority directed to related International Patent Application No. PCT/EP2018/059699, dated Aug. 2, 2018; 14 pages.

(Continued)

*Primary Examiner* — Deoram Persaud
(74) *Attorney, Agent, or Firm* — Sterne, Kessler, Goldstein & Fox P.L.L.C.

(57) ABSTRACT

A method including illuminating a product test substrate with radiation from a component, wherein the product test substrate does not have a device pattern etched therein and yields a non-zero sensitivity when illuminated, the non-zero sensitivity representing a change in an optical response characteristic of the product test substrate with respect to a change in a characteristic of the radiation; measuring at least a part of the radiation redirected by the product test substrate to determine a parameter value; and taking an action with respect to the component based on the parameter value.

25 Claims, 13 Drawing Sheets

(56) References Cited

U.S. PATENT DOCUMENTS

| | | | |
|---|---|---|---|
| 6,660,540 | B2 | 12/2003 | Englisch |
| 6,961,116 | B2 | 11/2005 | Den Boef et al. |
| 7,879,516 | B2 | 2/2011 | Kawachi et al. |
| 10,453,758 | B2 * | 10/2019 | Van Leest ............ G03F 7/70633 |
| 2005/0185174 | A1 | 8/2005 | Laan et al. |
| 2006/0033921 | A1 | 2/2006 | Den Boef et al. |
| 2006/0066855 | A1 | 3/2006 | Boef et al. |
| 2007/0222979 | A1 | 9/2007 | Van Der Laan et al. |
| 2008/0002207 | A1 | 1/2008 | Kok et al. |
| 2008/0266560 | A1 | 10/2008 | Kok |
| 2010/0201963 | A1 | 8/2010 | Cramer et al. |
| 2010/0220308 | A1 | 9/2010 | Kok |
| 2011/0027704 | A1 | 2/2011 | Cramer et al. |
| 2011/0043791 | A1 | 2/2011 | Smilde et al. |
| 2011/0292365 | A1 * | 12/2011 | Cramer ............... G03F 7/70616 355/67 |
| 2012/0123748 | A1 | 5/2012 | Aben et al. |
| 2012/0224183 | A1 * | 9/2012 | Fay .................... G01B 11/2441 356/491 |
| 2012/0242970 | A1 | 9/2012 | Smilde et al. |
| 2014/0063478 | A1 | 3/2014 | Manka et al. |
| 2015/0185625 | A1 * | 7/2015 | Chen ................... G03F 7/70683 702/182 |
| 2017/0052454 | A1 | 2/2017 | Jak et al. |
| 2018/0017881 | A1 | 1/2018 | Van Der Schaar et al. |
| 2018/0188658 | A1 * | 7/2018 | Van Der Post ..... G03F 7/70625 |
| 2019/0204755 | A1 * | 7/2019 | Kicken ............... G03F 7/70633 |

FOREIGN PATENT DOCUMENTS

| | | |
|---|---|---|
| CN | 101290475 A | 10/2008 |
| JP | H08-255751 A | 10/1996 |
| JP | 2007-523488 A | 8/2007 |
| JP | 2008-016840 A | 1/2008 |
| JP | 2008-053464 A | 3/2008 |
| JP | 2008-294094 A | 12/2008 |
| JP | 2011-174764 A | 9/2011 |
| JP | 2012-018097 A | 1/2012 |
| JP | 2013-534044 A | 8/2013 |
| JP | 2013-205367 A | 10/2013 |
| WO | WO 2005/081069 A1 | 9/2005 |
| WO | WO 2009/078708 A1 | 6/2009 |
| WO | WO 2009/106279 A1 | 9/2009 |
| WO | WO 2017/029110 A1 | 2/2017 |
| WO | WO 2017/102327 A1 | 6/2017 |

OTHER PUBLICATIONS

Bauer et al., "Swing curve measurement and simulation for high NA lithography," Proc. SPIE, Metrology, Inspection, and Process Control for Microlithography XX, vol. 6152, Mar. 24, 2006; 11 pages.

International Preliminary Report on Patentability and Written Opinion of the International Searching Authority directed to related International Patent Application No. PCT/EP2018/059699, dated Nov. 5, 2019; 11 pages.

Japanese Notice of Reasons for Refusal directed to related Japanese Patent Application No. 2019-554618, dated Nov. 25, 2020; 10 pages.

Japanese Search Report by Registered Search Organization directed to related Japanese Patent Application No. 2019-554618, dated Oct. 28, 2020; 92 pages.

Logofatu et al., "Scatterometry, an Optical Metrology Technique for Lithography," IEEE 2004 International Semiconductor Conference, Oct. 2004; 14 pages.

Niu et al., "Specular Spectroscopic Scatterometry," IEEE Transactions on Semiconductor Manufacturing, vol. 14, No. 2, May 2001; 15 pages.

Japanese Decision on Refusal directed to related Japanese Patent Application No. 2019-554618, dated Mar. 4, 2021; 6 pages.

* cited by examiner

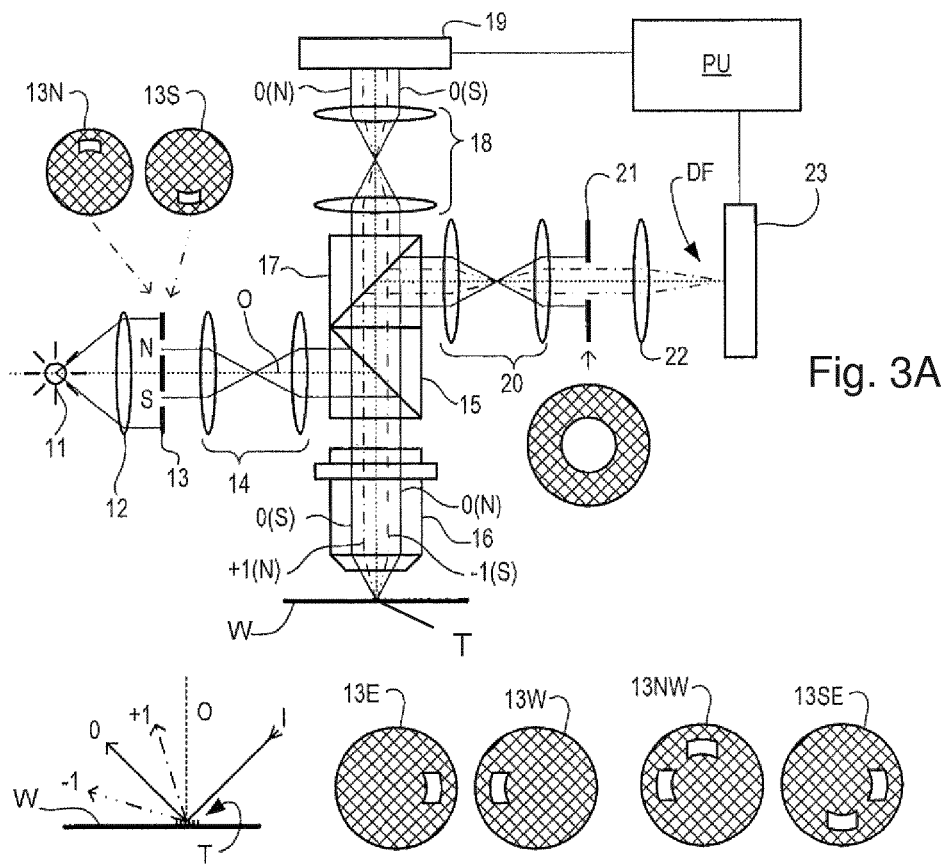
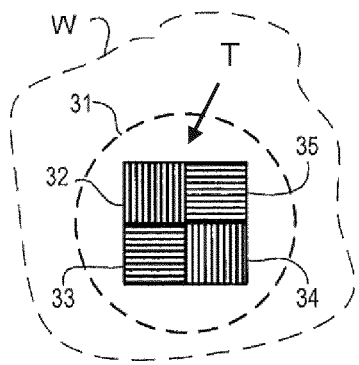
Fig. 4
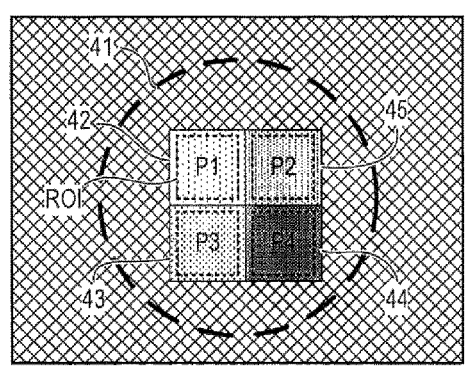
Fig. 5

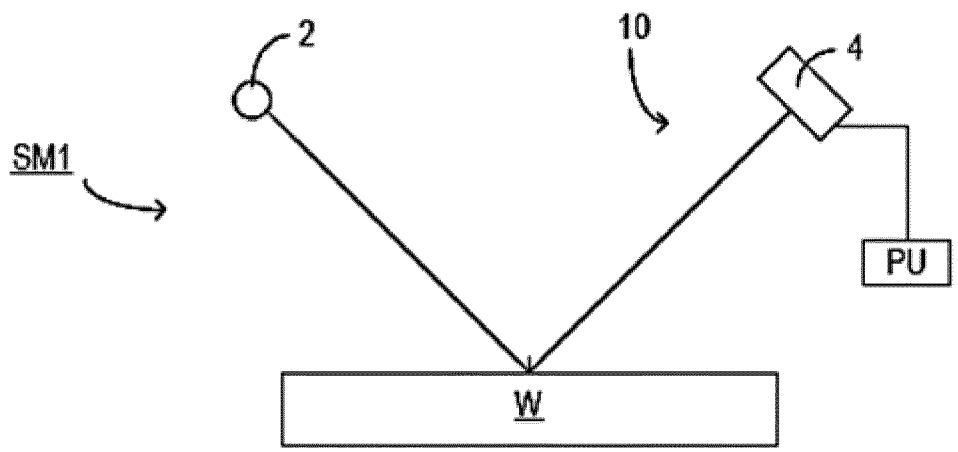
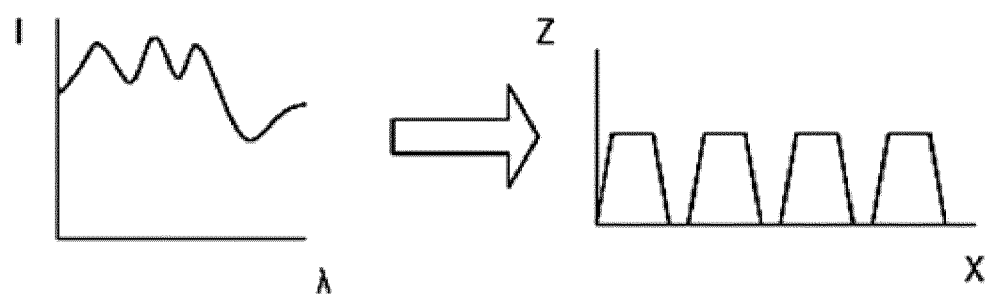
Fig. 6

METHOD, SUBSTRATE AND APPARATUS TO MEASURE PERFORMANCE OF OPTICAL METROLOGY

CROSS-REFERENCE TO RELATED APPLICATIONS

This application claims priority of U.S. Provisional Patent Application No. 62/501,515, which was filed on May 4, 2017, and which is incorporated herein in its entirety by reference.

FIELD

The present description relates to a method, substrate and apparatus to measure performance of optical metrology.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a circuit pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

Manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are involved in the patterning process.

Metrology processes are used at various steps during a patterning process to monitor and/or control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), one or more variables of the patterning process may be designed or altered, e.g., based on the measurements of the one or more characteristics, such that substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of alignment, overlay, critical dimension (CD), etc. has become more and more stringent. Error, such as error in alignment, error in overlay, error in CD, etc., will inevitably be produced in the patterning process. For example, alignment and/or imaging error may be produced from optical aberration, patterning device heating, patterning device error, and/or substrate heating and can be characterized in terms of, e.g., alignment, overlay, CD, etc. Additionally or alternatively, error may be introduced in other parts of the patterning process, such as in etch, development, bake, etc. and similarly can be characterized in terms of, e.g., overlay, CD, etc. The error may cause a problem in terms of the functioning of the device, including failure of the device to function or one or more electrical problems of the functioning device. Accordingly, it is desirable to be able to characterize one or more these errors and take steps to design, modify, control, etc. a patterning process to reduce or minimize one or more of these errors.

In an embodiment, there is provided a method comprising: illuminating a product test substrate with radiation from a component, wherein the product test substrate does not comprise a device pattern etched therein and yields a non-zero sensitivity when illuminated, the non-zero sensitivity representing a change in an optical response characteristic of the product test substrate with respect to a change in a characteristic of the radiation; measuring at least a part of the radiation redirected by the product test substrate to determine a parameter value; and taking an action with respect to the component based on the parameter value.

In an embodiment, there is provided a method comprising: calculating an optical response for a product test substrate illuminated by radiation in order to determine one or more physical characteristics of the product test substrate that would yield a non-zero sensitivity when illuminated, the non-zero sensitivity representing a change in an optical response characteristic of the product test substrate with respect to a change in a characteristic of the radiation; and generating electronic instructions comprising the one or more physical characteristic to generate the product test substrate.

In an embodiment, there is provided a product test substrate for illumination with radiation from a component, wherein the product test substrate does not comprise a device pattern etched therein and yields a non-zero sensitivity when illuminated, the non-zero sensitivity representing a change in an optical response characteristic of the product test substrate with respect to a change in a characteristic of the radiation.

In an aspect, there is provided a non-transitory computer program product comprising machine-readable instructions for causing a processor system to cause performance of a method described herein. In an aspect, there is provided a computer program product comprising a computer non-transitory readable medium having instructions recorded thereon, the instructions when executed by a computer implementing a method or one or more process steps described herein.

In an aspect, there is provided a metrology apparatus for measuring an object of a patterning process, the metrology apparatus configured to perform a method as described herein. In an aspect, there is provided an inspection apparatus for inspecting an object of a patterning process, the inspection apparatus being operable to perform a method as described herein.

In an aspect, there is provided a system comprising: a metrology apparatus configured to provide a beam of radiation onto an object surface and to detect radiation redirected by the structure on the object surface; and a computer program product as described herein. In an embodiment, the system further comprises a lithographic apparatus comprising a support structure configured to hold a patterning device to modulate a radiation beam and a projection optical system arranged to project the modulated radiation beam onto a radiation-sensitive substrate, wherein the object is the substrate.

In an embodiment, there is provided a system comprising: a hardware processor system; and a non-transitory computer readable storage medium configured to store machine-readable instructions, wherein when executed, the machine-readable instructions cause the hardware processor system to perform a method as described herein.

BRIEF DESCRIPTION OF THE DRAWINGS

Embodiments will now be described, by way of example only, with reference to the accompanying drawings in which:

FIG. 3A is schematic diagram of a measurement apparatus for use in measuring targets according to an embodiment using a first pair of illumination apertures providing certain illumination modes;

FIG. 3B is a schematic detail of a diffraction spectrum of a target for a given direction of illumination;

FIG. 3C is a schematic illustration of a second pair of illumination apertures providing further illumination modes in using a measurement apparatus for diffraction based overlay measurements;

FIG. 3D is a schematic illustration of a third pair of illumination apertures combining the first and second pairs of apertures providing further illumination modes in using a measurement apparatus for diffraction based overlay measurements;

FIG. 4 schematically depicts a form of multiple periodic structure (e.g., multiple grating) target and an outline of a measurement spot on a substrate;

FIG. 5 schematically depicts an image of the target of FIG. 4 obtained in the apparatus of FIG. 3;

FIG. 6 schematically depicts an example metrology apparatus and metrology technique;

DETAILED DESCRIPTION

Before describing embodiments in detail, it is instructive to present an example environment in which embodiments may be implemented.

Figure 1:
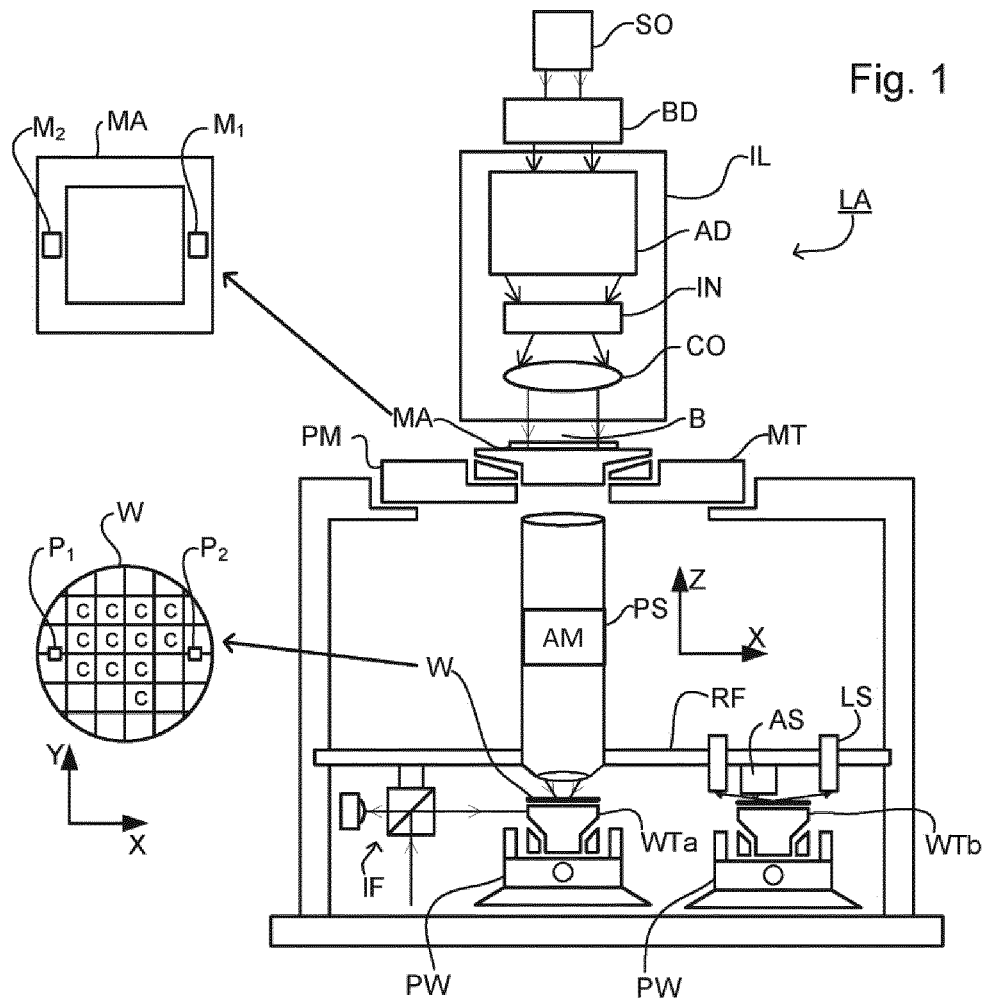
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Figure 2:
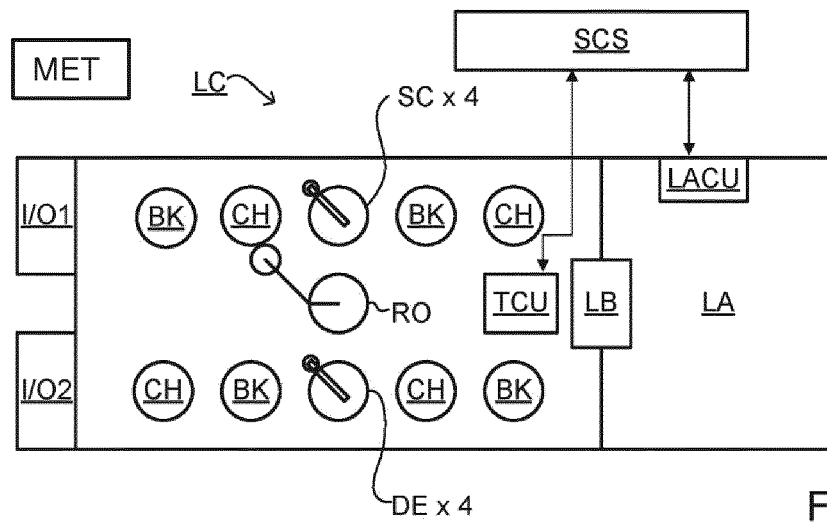
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which measures some or all of the substrates W that have been processed in the lithocell or other objects in the lithocell. The metrology system MET may be part of the lithocell LC, for example it may be part of the lithographic apparatus LA (such as alignment sensor AS).

The one or more measured parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching or can be performed after-etch.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. This may be termed diffraction-based metrology. One such application of this diffraction-based metrology is in the measurement of feature asymmetry within a target. This can be used as a measure of overlay, for example, but other applications are also known. For example, asymmetry can be measured by comparing opposite parts of the diffraction spectrum (for example, comparing the −1st and +1$^{st}$ orders in the diffraction spectrum of a periodic grating). This can be done as described above and as described, for example, in U.S. patent application publication US2006-066855, which is incorporated herein in its entirety by reference. Another application of diffraction-based metrology is in the measurement of feature width (CD) within a target. Such techniques can use the apparatus and methods described hereafter.

Thus, in a device fabrication process (e.g., a patterning process or a lithography process), a substrate or other objects may be subjected to various types of measurement before, during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as ASML YieldStar, ASML SMASH GridAlign), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. As noted above, the metrology apparatus may be integrated into the lithographic apparatus LA or the lithocell LC or may be a stand-alone device.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

A metrology apparatus suitable for use in embodiments to measure, e.g., overlay is schematically shown in FIG. 3A. A target T (comprising a periodic structure such as a grating) and diffracted rays are illustrated in more detail in FIG. 3B. The metrology apparatus may be a stand-alone device or incorporated in either the lithographic apparatus LA, e.g., at the measurement station, or the lithographic cell LC. An optical axis, which has several branches throughout the apparatus, is represented by a dotted line 0. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides a substrate image onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals.

As shown in FIG. 3B, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIGS. 3A and 3B are shown somewhat off axis, purely to enable them to be more easily distinguished in the diagram. At least the 0 and +1 orders diffracted by the target on substrate W are collected by objective lens 16 and directed back through prism 15.

Returning to FIG. 3A, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1st and the +1st diffraction order intensities. Comparing these intensities for a given target provides a measurement of asymmetry in the target, and asymmetry in the target can be used as an indicator of a parameter of a lithography process, e.g., overlay. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements. The pupil plane image can also be used for other measurement purposes such as reconstruction, as described further hereafter.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane of the objective lens 16. Aperture stop 21 functions to block the zeroth order diffracted beam so that the image of the target formed on sensor 23 is formed from the −1 or +1 first order beam. Data regarding the images measured by sensors 19 and 23 are output to processor and controller PU, the function of which will depend on the particular type of measurements being performed. Note that the term 'image' is used in a broad sense. An image of the periodic structure features (e.g., grating lines) as such will not be formed, if only one of the −1 and +1 orders is present.

The particular forms of aperture plate 13 and stop 21 shown in FIG. 3 are purely examples. In another embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIGS. 3C and D. FIG. 3C illustrates two further types of off-axis illumination mode. In a first illumination mode of FIG. 3C, aperture plate 13E provides off-axis illumination from a direction designated, for the sake of description only, as 'east' relative to the 'north' previously described. In a second illumination mode of FIG. 3C, aperture plate 13W is used to provide similar illumination, but from an opposite direction, labeled 'west'. FIG. 3D illustrates two further types of off-axis illumination mode. In a first illumination mode of FIG. 3D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

FIG. 4 depicts an example composite metrology target T formed on a substrate. The composite target comprises four periodic structures (in this case, gratings) 32, 33, 34, 35 positioned closely together. In an embodiment, the periodic structure layout may be made smaller than the measurement spot (i.e., the periodic structure layout is overfilled). Thus, in an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 μm×20 μm or within 16 μm×16 μm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Returning to FIG. 4, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets +d and −d respectively. While four periodic structures are illustrated, another embodiment may include a larger matrix to obtain desired accuracy. For example, a 3×3 array of nine composite periodic structures may have biases −4d, −3d, −2d, −d, 0, +d, +2d, +3d, +4d. Separate images of these periodic structures can be identified in an image captured by sensor 23.

FIG. 5 shows an example of an image that may be formed on and detected by the sensor 23, using the target of FIG. 4 in the apparatus of FIG. 3, using the aperture plates 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. The target can be positioned in among device product features, rather than or in addition to in a scribe lane. If the periodic structures are located in device product areas, device features may also be visible in the periphery of this image field. Processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an example of such a parameter.

In an embodiment, one of the parameters of interest of a patterning process is feature width (e.g., CD). FIG. 6 depicts a highly schematic example metrology apparatus (e.g., a scatterometer) that can enable feature width determination. It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 6. In general, for the reconstruction the general form of the structure is known and some variables are assumed from knowledge of the process by which the structure was made, leaving only a few variables of the structure to be determined from the measured data. Such a metrology apparatus may be configured as a normal-incidence metrology apparatus or an oblique-incidence metrology apparatus. Moreover, in addition to measurement of a parameter by reconstruction, angle resolved scatterometry is useful in the measurement of asymmetry of features in product and/or resist patterns. A particular application of asymmetry measurement is for the measurement of overlay, where the target comprises one set of periodic features superimposed on another. The concepts of asymmetry measurement in this manner are described, for example, in U.S. patent application publication US2006-066855, which is incorporated herein in its entirety.

Figure 7:
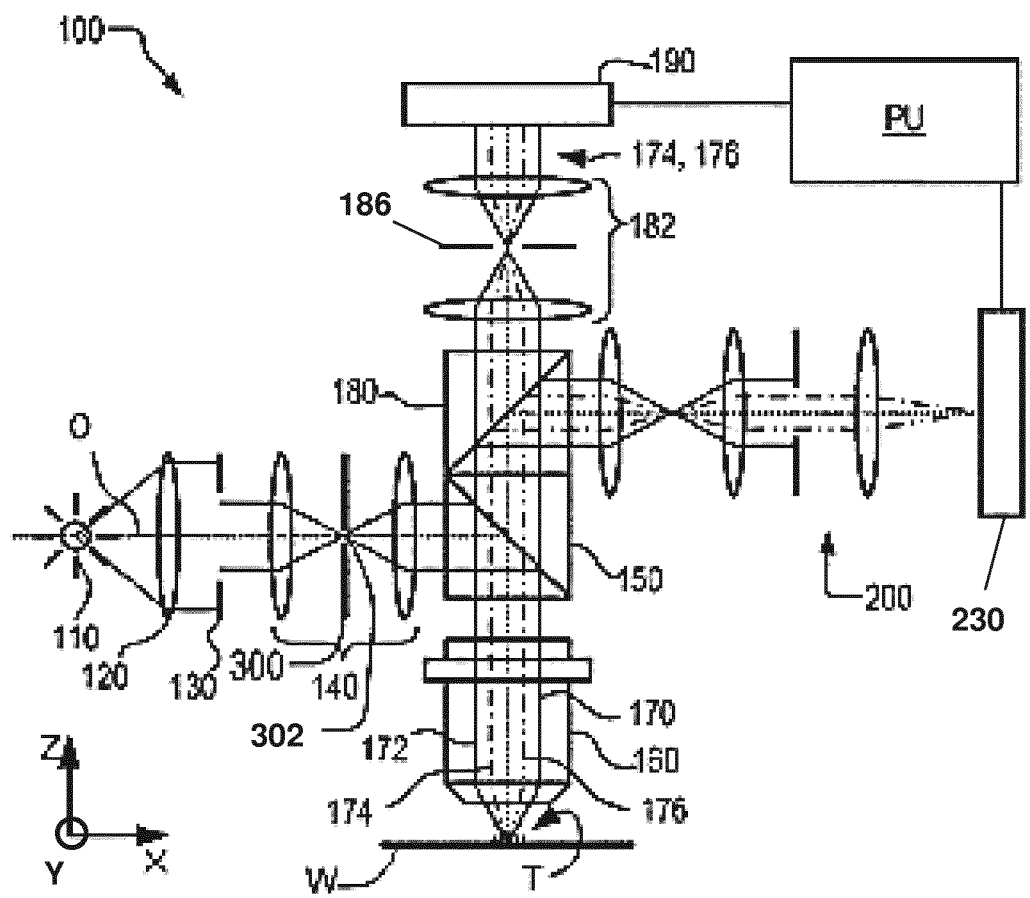
FIG. 7 schematically depicts an example metrology apparatus.

FIG. 7 illustrates an example of a metrology apparatus 100 suitable for use in embodiments of the invention disclosed herein. The principles of operation of this type of metrology apparatus are explained in more detail in the U.S. Patent Application Nos. US 2006-033921 and US 2010-201963, which are incorporated herein in their entireties by reference. An optical axis, which has several branches throughout the apparatus, is represented by a dotted line 0. In this apparatus, radiation emitted by source 110 (e.g., a xenon lamp) is directed onto substrate W via by an optical system comprising: lens system 120, aperture plate 130, lens system 140, a partially reflecting surface 150 and objective lens 160. In an embodiment these lens systems 120, 140, 160 are arranged in a double sequence of a 4F arrangement. In an embodiment, the radiation emitted by radiation source 110 is collimated using lens system 120. A different lens arrangement can be used, if desired. The angular range at which the radiation is incident on the substrate can be selected by defining a spatial intensity distribution in a plane that presents the spatial spectrum of the substrate plane. In particular, this can be done by inserting an aperture plate 130 of suitable form between lenses 120 and 140, in a plane which is a back-projected image of the objective lens pupil plane. Different intensity distributions (e.g., annular, dipole, etc.) are possible by using different apertures. The angular distribution of illumination in radial and peripheral directions, as well as properties such as wavelength, polarization and/or coherency of the radiation, can all be adjusted to obtain desired results. For example, one or more interference filters 130 (see FIG. 9) can be provided between source 110 and partially reflecting surface 150 to select a wavelength of interest in the range of, say, 400-900 nm or even lower, such as 200-300 nm. The interference filter may be tunable rather than comprising a set of different filters. A grating could be used instead of an interference filter. In an embodiment, one or more polarizers 170 (see FIG. 9) can be provided between source 110 and partially reflecting surface 150 to select a polarization of interest. The polarizer may be tunable rather than comprising a set of different polarizers.

As shown in FIG. 7, the target T is placed with substrate W normal to the optical axis O of objective lens 160. Thus, radiation from source 110 is reflected by partially reflecting surface 150 and focused into an illumination spot S (see FIG. 8) on target T on substrate W via objective lens 160. In an embodiment, objective lens 160 has a high numerical aperture (NA), desirably at least 0.9 or at least 0.95. An immersion metrology apparatus (using a relatively high refractive index fluid such as water) may even have a numerical aperture over 1.

Rays of illumination 170, 172 focused to the illumination spot from angles off the axis O gives rise to diffracted rays 174, 176. It should be remembered that these rays are just one of many parallel rays covering an area of the substrate including target T. Each element within the illumination spot is within the field of view of the metrology apparatus. Since the aperture in plate 130 has a finite width (necessary to admit a useful quantity of radiation), the incident rays 170, 172 will in fact occupy a range of angles, and the diffracted rays 174, 176 will be spread out somewhat. According to the point spread function of a small target, each diffraction order will be further spread over a range of angles, not a single ideal ray as shown.

At least the $0^{th}$ order diffracted by the target on substrate W is collected by objective lens 160 and directed back through partially reflecting surface 150. An optical element 180 provides at least part of the diffracted beams to optical system 182 which forms a diffraction spectrum (pupil plane image) of the target T on sensor 190 (e.g. a CCD or CMOS sensor) using the zeroth and/or first order diffractive beams. In an embodiment, an aperture 186 is provided to filter out certain diffraction orders so that a particular diffraction order is provided to the sensor 190. In an embodiment, the aperture 186 allows substantially or primarily only zeroth order radiation to reach the sensor 190. In an embodiment, the sensor 190 may be a two-dimensional detector so that a two-dimensional angular scatter spectrum of a substrate target T can be measured. The sensor 190 may be, for example, an array of CCD or CMOS sensors, and may use an integration time of, for example, 40 milliseconds per frame. The sensor 190 may be used to measure the intensity of redirected radiation at a single wavelength (or narrow wavelength range), the intensity separately at multiple wavelengths or integrated over a wavelength range. Furthermore, the sensor may be used to separately measure the intensity of radiation with transverse magnetic- and/or transverse electric-polarization and/or the phase difference between transverse magnetic- and transverse electric-polarized radiation.

Optionally, optical element 180 provides at least part of the diffracted beams to measurement branch 200 to form an image of the target on the substrate W on a sensor 230 (e.g. a CCD or CMOS sensor). The measurement branch 200 can be used for various auxiliary functions such as focusing the metrology apparatus (i.e., enabling the substrate W to be in focus with the objective 160), and/or for dark field imaging of the type mentioned in the introduction.

In order to provide a customized field of view for different sizes and shapes of grating, an adjustable field stop 300 is provided within the lens system 140 on the path from source 110 to the objective lens 160. The field stop 300 contains an aperture 302 and is located in a plane conjugate with the plane of the target T, so that the illumination spot becomes an image of the aperture 302. The image may be scaled according to a magnification factor, or the aperture and illumination spot may be in 1:1 size relation. In order to make the illumination adaptable to different types of measurement, the aperture plate 300 may comprise a number of aperture patterns formed around a disc, which rotates to bring a desired pattern into place. Alternatively or in addition, a set of plates 300 could be provided and swapped, to achieve the same effect. Additionally or alternatively, a programmable aperture device such as a deformable minor array or transmissive spatial light modulator can be used also.

Typically, a target will be aligned with its periodic structure features running either parallel to the Y axis or parallel to the X axis. With regard to its diffractive behavior, a periodic structure with features extending in a direction parallel to the Y axis has periodicity in the X direction, while the a periodic structure with features extending in a direction parallel to the X axis has periodicity in the Y direction. In order to measure the performance in both directions, both types of features are generally provided. While for simplicity there will be reference to lines and spaces, the periodic structure need not be formed of lines and space. Moreover, each line and/or space between lines may be a structure formed of smaller sub-structures. Further, the periodic structure may be formed with periodicity in two dimensions at once, for example where the periodic structure comprises posts and/or via holes.

Figure 8:
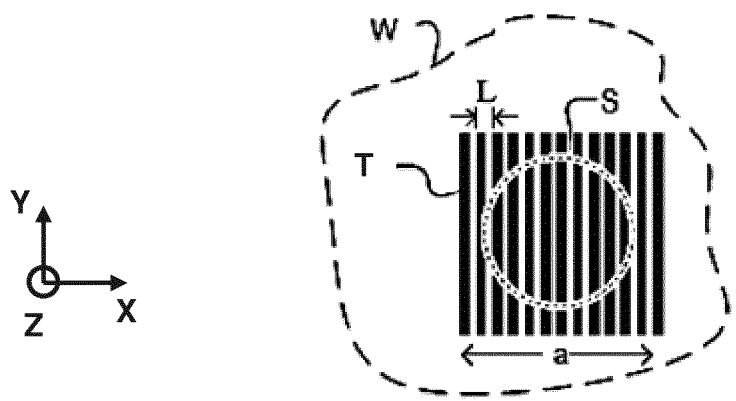
FIG. 8 illustrates the relationship between an illumination spot of a metrology apparatus and a metrology target.

FIG. 8 illustrates a plan view of a typical target T, and the extent of illumination spot S in the apparatus of FIG. 7. To obtain a diffraction spectrum that is free of interference from surrounding structures, the target T, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. This simplifies mathematical reconstruction of the target as it can be regarded as infinite.

Figure 9:
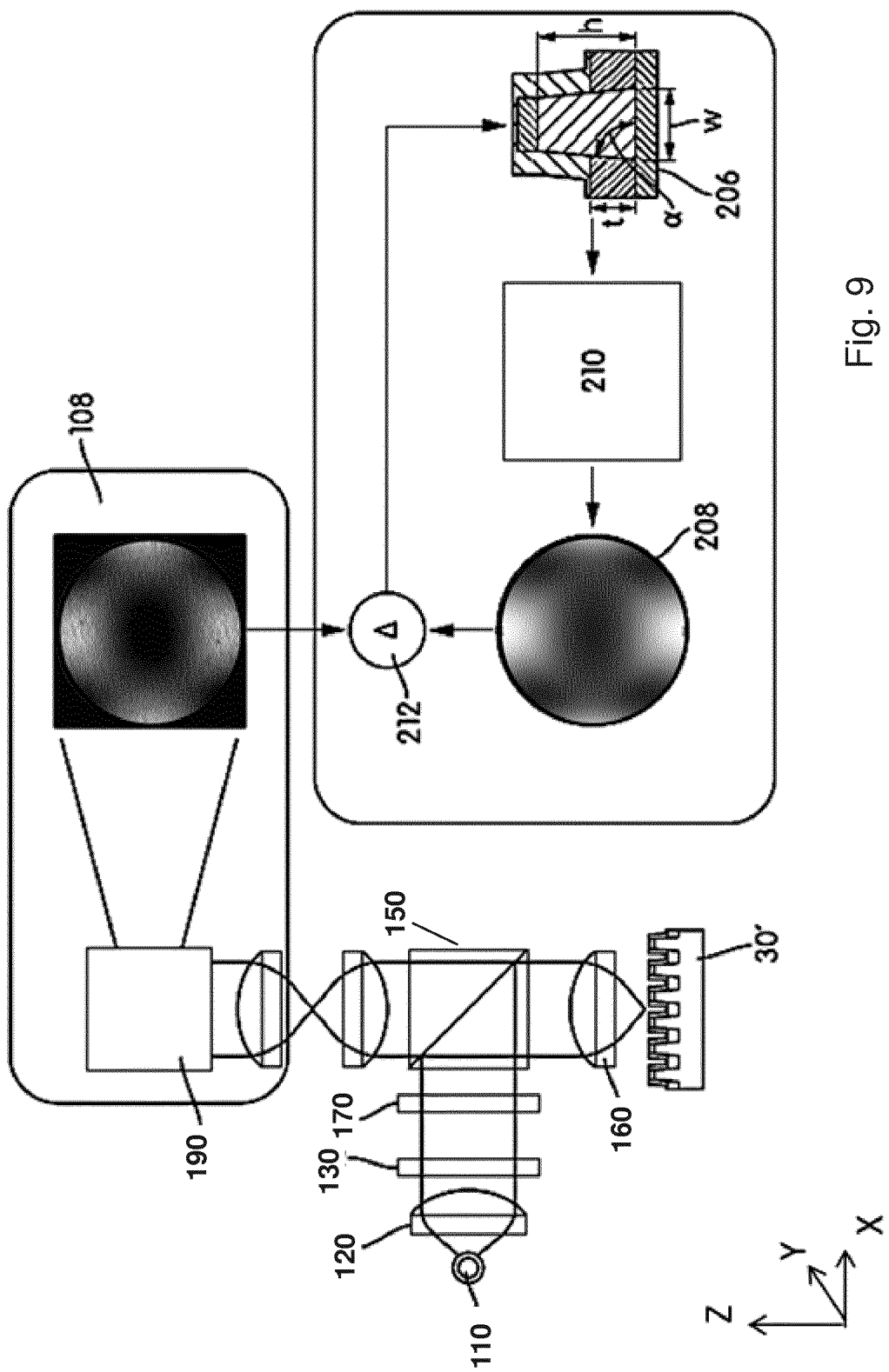
FIG. 9 schematically depicts a process of deriving one or more variables of interest based on measurement data.

FIG. 9 schematically depicts an example process of the determination of the value of one or more variables of interest of a target pattern 30' based on measurement data obtained using metrology. Radiation detected by the detector 190 provides a measured radiation distribution 108 for target 30'.

For the given target 30', a radiation distribution 208 can be computed/simulated from a parameterized mathematical model 206 using, for example, a numerical Maxwell solver 210. The parameterized mathematical model 206 shows example layers of various materials making up, and associated with, the target. The parameterized mathematical model 206 may include one or more of variables for the features and layers of the portion of the target under consideration, which may be varied and derived. As shown in FIG. 9, the one or more of the variables may include the thickness t of one or more layers, a width w (e.g., CD) of one or more features, a height h of one or more features, a sidewall angle α of one or more features, and/or relative position between features (herein considered overlay). Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. One or more values of one or more parameters of a 1-D periodic structure or a 2-D periodic structure, such as a value of width, length, shape or a 3-D profile characteristic, may be input to the reconstruction process from knowledge of the patterning process and/or other measurement processes. For example, the initial values of the variables may be those expected values of one or more parameters, such as a value of CD, pitch, etc., for the target being measured.

In some cases, a target can be divided into a plurality of instances of a unit cell. To help ease computation of the radiation distribution of a target in that case, the model 206 can be designed to compute/simulate using the unit cell of the structure of the target, where the unit cell is repeated as instances across the full target. Thus, the model 206 can compute using one unit cell and copy the results to fit a whole target using appropriate boundary conditions in order to determine the radiation distribution of the target.

Additionally or alternatively to computing the radiation distribution 208 at the time of reconstruction, a plurality of radiation distributions 208 can be pre-computed for a plurality of variations of variables of the target portion under consideration to create a library of radiation distributions for use at the time of reconstruction.

The measured radiation distribution 108 is then compared at 212 to the computed radiation distribution 208 (e.g., computed near that time or obtained from a library) to determine the difference between the two. If there is a difference, the values of one or more of the variables of the parameterized mathematical model 206 may be varied, a new computed radiation distribution 208 obtained (e.g., calculated or obtained from a library) and compared against the measured radiation distribution 108 until there is sufficient match between the measured radiation distribution 108 and the radiation distribution 208. At that point, the values of the variables of the parameterized mathematical model 206 provide a good or best match of the geometry of the actual target 30'. In an embodiment, there is sufficient match when a difference between the measured radiation distribution 108 and the computed radiation distribution 208 is within a tolerance threshold.

In an embodiment, one of the parameters of interest of a patterning process is alignment (e.g., between a substrate and the patterning device). So, as described above, a substrate (and/or a substrate table and/or the patterning device) may be provided with one or more alignment targets to provide a reference location on the substrate, and the lithographic apparatus is provided with an alignment system to measure the alignment position of the one or more alignment targets. By measuring the alignment position of the one or more alignment targets, in principle the position of one or more points on the substrate can be predicted, e.g., the location of a previously exposed target portion can be calculated and the lithographic apparatus can be controlled to expose a successive target portion on top of the previously exposed target portion.

Usually, an alignment target on the substrate comprises one or more diffraction gratings. The alignment system of the lithographic apparatus then comprises an alignment sensor system with a radiation source to emit radiation towards the one or more gratings and a detector to detect diffracted radiation from the one or more grating, e.g., radiation diffracted in a first, second, third and/or higher order, which is used in order to determine the position of the one or more gratings.

And, while examples of an inspection apparatus have been described (mostly operating on scatterometry principles), an alignment apparatus operates on similar principles of providing radiation from a source onto a target (e.g., an alignment grating), detecting a redirected portion (e.g., diffracted) of the radiation from the target using a detector, and analyzing the detected radiation to determine alignment between two or more objects (e.g., a substrate and a patterning device).

Figure 10:
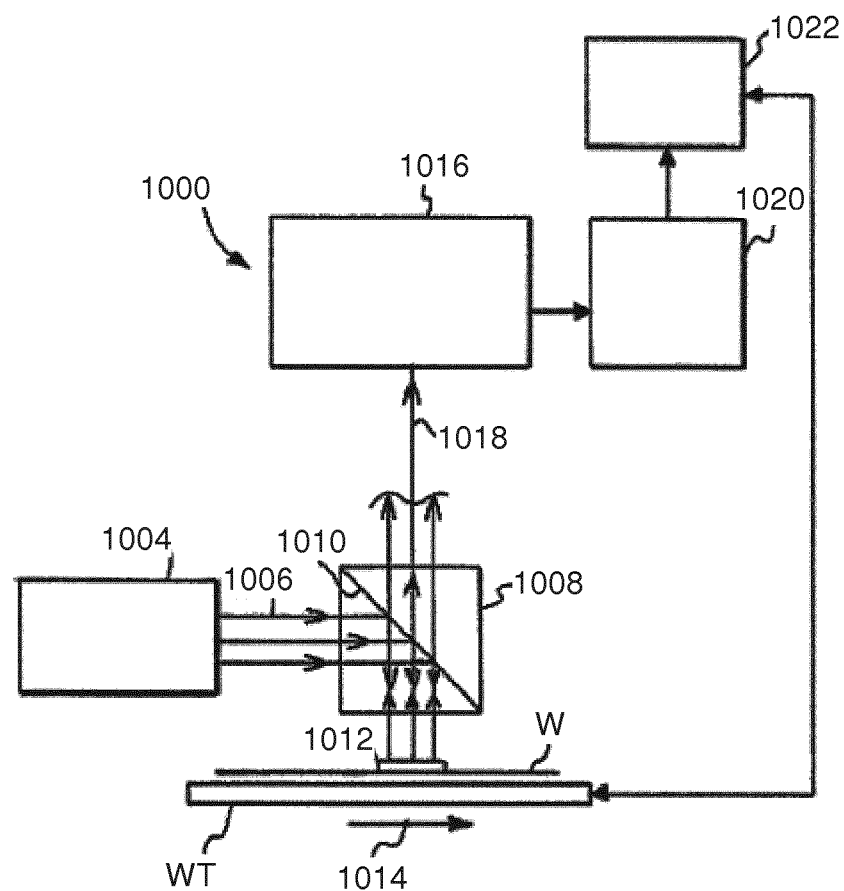
FIG. 10 is a schematic diagram illustrating an example alignment system.

FIG. 10 is a schematic diagram illustrating an example alignment system 1000. The alignment system 1000 comprises a coherent illumination source 1004, such as a laser, providing electromagnetic radiation 1006, to a prism 1008. At least a portion of the electromagnetic radiation is reflected off interface 1010 to illuminate an alignment target 1012 (e.g., an alignment mark), which may be located on a substrate W, on a substrate table WT, etc. The alignment target 1012 may have one hundred and eighty degree symmetry. By one hundred and eighty degree symmetry, it is meant that when the alignment target 1012 is rotated one hundred and eighty degrees about an axis of symmetry perpendicular to the plane of the alignment target 1012, the alignment target is substantially identical to the unrotated alignment target. The axis for which this is true is called the axis of symmetry. In an embodiment, the alignment target 1012 is located in a radiation-sensitive film on the substrate W.

In an embodiment, relative motion is provided between the alignment target 1012 and the radiation beam in the direction indicated by arrow 1014 (by, e.g., moving substrate table WT). Electromagnetic radiation redirected by the alignment target 1012 passes through the prism 1008 and is collected by an image rotation interferometer 1016. It should be appreciated that a good quality image need not be formed, but that the features of the alignment target should be resolved. The image rotation interferometer 1016 may be any appropriate set of optical elements, and is, in an embodiment, a combination of prisms, that form two images of the alignment target, rotates one of the images with respect to the other one hundred and eighty degrees and then recombines the two images interferometrically so that when aligned with the alignment target 1012, the electromagnetic radiation will interfere either in a polarization sense or in an amplitude sense, constructively or destructively, making readily detectable the center of the alignment target 1012. The optical ray passing through the center of rotation established by the interferometer, 1016, defines the sensor alignment axis 1018.

A detector 1020 receives the electromagnetic radiation from the image rotation interferometer 1016. The detector 1020 then provides one or more signals to the signal analyzer 1022. The signal analyzer 1022 is coupled to the substrate table WT or its position sensor IF such that the position of the substrate table WT is known when the center of the alignment target 1012 is determined. Therefore, the position of the alignment target 1012 is accurately known with reference to the substrate table WT. Alternatively, the location of the alignment sensor 1000 may be known such that the center of the alignment target 1012 is known with reference to the alignment sensor 1000. Accordingly, the exact location of the center of the alignment target 1012 is known relative to a reference position.

In an embodiment, the illumination source 1004 comprises a 4-color laser module assembly (LMA) and a polarized multiplexer (PMUX). The LMA is configured to generate four distinct laser beams. For example, LMA may generate a 532 nm green wavelength beam of radiation, a 633 nm red wavelength beam of radiation, a 780 nm near infrared wavelength beam of radiation and an 850 nm far infrared wavelength beam of radiation. The polarized multiplexer is configured to multiplex the four laser beams generated by the LMA into a single polarized beam that serves as the illumination source for alignment system 1000. As will be appreciated, more or less wavelengths can be produced.

In an embodiment, the measurement accuracy and/or sensitivity of a target may vary with respect to one or more characteristics of the beam of radiation provided onto the target, for example, the wavelength of the radiation beam, the polarization of the radiation beam, the phase of the radiation beam, the intensity distribution (i.e., angular or spatial intensity distribution) of the radiation beam, the incident angle of the radiation beam on the substrate, etc. Thus, a particular measurement strategy can be selected that desirably obtains, e.g., good measurement accuracy and/or sensitivity of the target.

To enable measurement, a measurement recipe can be used that specifies one or more parameters of the measurement using the measurement system. In an embodiment, the term "measurement recipe" includes one or more parameters of the measurement itself, one or more parameters of a pattern measured, or both. For example, if the measurement used in a measurement recipe is a diffraction-based optical measurement, one or more parameters of the measurement itself may include a wavelength of measurement radiation, a polarization of measurement radiation, phase of the radiation beam, an incident angle relative to the substrate of measurement radiation, and/or the relative orientation relative to a pattern on the substrate of diffracted measurement radiation. The one or more parameters of the measurement itself may include one or more parameters of the metrology apparatus used in the measurement. A pattern measured may be a pattern whose diffraction is measured. The pattern measured may be a pattern specially designed or selected for measurement purposes (also known as a "target" or "target structure"). Multiple copies of a target may be placed on many places on a substrate. A measurement recipe may be used to align a layer of a pattern being imaged against an existing pattern on a substrate. A measurement recipe may be used to align the patterning device to the substrate, by measuring a relative position of the substrate. If the measurement recipe comprises one or more parameters of a pattern measured, the one or more parameters of the pattern measured may include an identification of the pattern (e.g., distinguishing a pattern being from another pattern), and/or a shape at least part of the pattern, and/or orientation of at least part of the pattern, and/or a pitch of at least part of the pattern (e.g., pitch of a periodic structure including the pitch of an upper periodic structure in a layer above that of a lower periodic structure and/or the pitch of the lower periodic structure), and/or a size (e.g., CD) of at least part of the pattern (e.g., the CD of a feature of a periodic structure, including that of a feature of the upper periodic structure and/or the lower periodic structure), and/or a materials property (e.g., refractive index, extinction coefficient, material type, etc.) of at least part of the pattern, and/or a segmentation of a feature of the pattern (e.g., a division of a feature of a periodic structure into sub-structures), etc.

A measurement recipe may be expressed in a form like $(r_1, r_2, r_3, \ldots r_n; t_1, t_2, t_3, \ldots t_m)$, where $r_i$ are one or more parameters of the measurement and $t_j$ are one or more parameters of one or more patterns measured. As will be appreciated, n and m can be 1. Further, the measurement recipe does not need to have both one or more parameters of the measurement and one or more parameters of one or more patterns measured; it can have just one or more parameters of the measurement or have just one or more parameters of one or more patterns measured.

Now, patterning processes in practice (e.g., as performed by device manufacturers) can involve diverse processing techniques that deposit layers of various materials (also referred to as the stack) on a substrate. These process layers interact with radiation in various systems and stages throughout the lifecycle of the patterning process. For example, radiation from an alignment sensor, a level sensor, an exposure projection system (e.g., the exposure radiation), an overlay, CD, etc. inspection metrology apparatus, etc. can interact with the various layers on a substrate when the substrate is exposed/measured.

Figure 11:
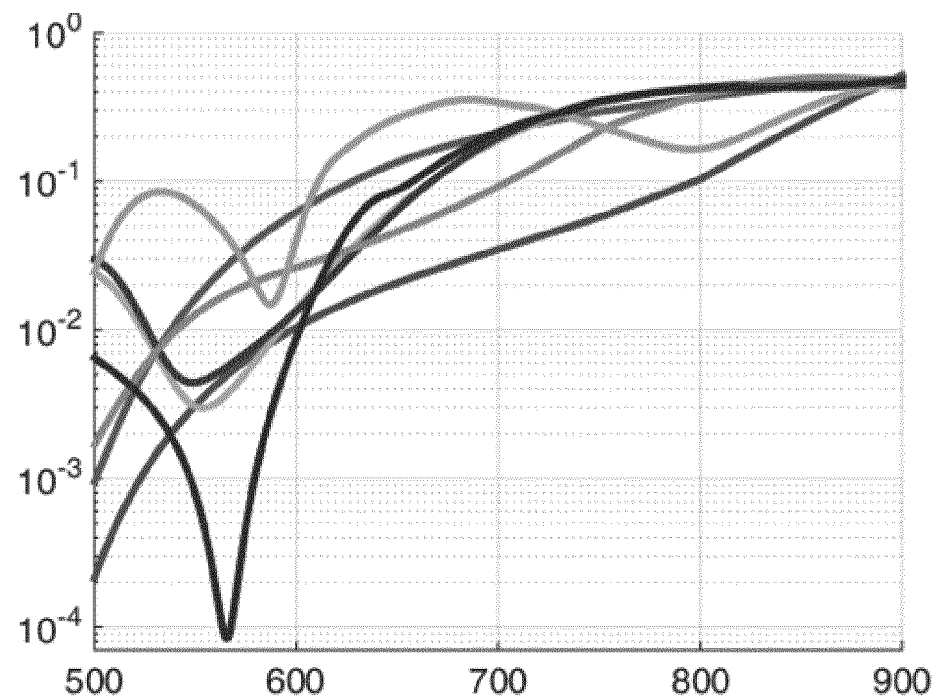
FIG. 11 is an example graph of detected radiation intensity from various different kinds of product substrate as a function of incident radiation wavelength.

Depending on the various index of refraction values, extinction coefficients, thicknesses of the layers, etc., these systems can have diverse responses to incident radiation. An example of the diverse spectral response is shown in FIG. 11. FIG. 11 depicts curves for substrates produced by 7 different patterning processes involving different combinations of materials on the substrate and measured for alignment using different wavelengths of radiation. Each curve represents a substrate from one of the 7 different patterning processes. The horizontal axis corresponds to the wavelength of an alignment measurement beam (500 nm to 900 nm) used to measure a mark on the substrate and the vertical axis corresponds to normalized $1^{st}$ order diffraction intensity. Each curve is determined for a same type of mark on the substrate of each different patterning process. These curves are examples of swing curves. More generally, swing curves as referred to herein describe a relationship between an optical response characteristic (e.g., intensity, diffraction efficiency, etc.) and a characteristic (e.g., wavelength, polarization, phase, incident angle, etc.) of the radiation used to produce the optical response characteristic. Moreover, a swing curve need not be graphically represented; the term swing curve encompasses the relationship expressed merely in terms of data. So, the swing curve can be represented merely as data, represented graphically, or both.

FIG. 11 shows that there can be a diverse nature of spectrums across the different patterning processes. It can be seen that the intensity can change significantly for small changes in wavelength for a substrate of a particular patterning process and that the intensity can have a fairly wide range of values across a range of wavelengths for a substrate of a particular patterning process. Moreover, that variation and range can be quite different for substrates from different patterning processes. Also, some of the curves can effectively have peaks or discontinuities in the responses, while others do not.

Figure 12:
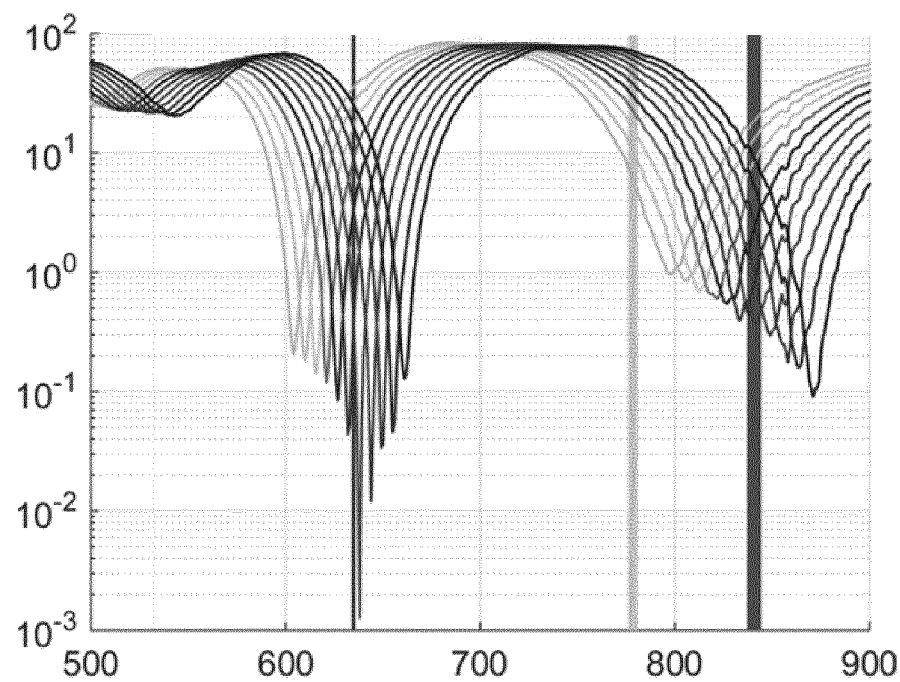
FIG. 12 is an example graph of detected radiation intensity from a particular kind of product substrate as a function of incident radiation wavelength, wherein the different curves correspond to different thicknesses of the stack on the substrate.

Further, as shown in FIG. 12, a spectral response curve can significantly change with a small change in thickness of the layers on the substrate. Like FIG. 11, the horizontal axis corresponds to the wavelength of an alignment measurement beam (500 nm to 900 nm) used to measure a mark on the substrate and the vertical axis corresponds to normalized $1^{st}$ order diffraction intensity. In FIG. 12, each curve corresponds to a substrate from the same patterning process but with a variation in thickness of the stack. Particularly, each curve corresponds to a substrate where the thickness of the stack was varied +/−5% in 1% steps from a nominal stack. As seen in FIG. 12, for this example, while the curves have the same general shape, they can change in their range of values, they can shift along the horizontal axis, etc. Thus, a change in thickness of the stack can lead to a significant change in response.

As will be appreciated, different components in the lithocell that use radiation interact at different portions of a swing curve for a substrate of a patterning process. For example, an alignment sensor (such as a tool of FIG. 10) can probe at different wavelengths in the visible or near infrared (e.g., ~532 nm, ~635 nm, ~780 nm, ~845 nm). A level sensor can probe at different wavelengths in the ultraviolet, visible or near infrared (e.g., ~225-400 nm or ~600-1050 nm). An overlay, CD, etc. metrology inspection tool (such as one of the tools of FIGS. 3-9) can probe a substrate in the substrate in the visible or near infrared. An exposure projection system can project an exposure beam onto the substrate in the ultraviolet and extreme ultraviolet (e.g., around 13.5 nm, around 193 nm, around 248 nm, around 365 nm). So, the performance of, or the performance using, each of these components can be affected differently by the stack. Moreover, that performance can vary depending on a change in the stack (e.g., a process variation in the thickness of one or more layers of the stack) and can vary from substrate to substrate and within a substrate due to variations.

So, in an embodiment, one or more of these components can be calibrated on a simple single layer stack. However, accuracy error or suboptimal performance can occur with complex multi-layer process stacks. For example, for exposing photoresist, differences in the optical properties of the underlying layers change the optimal dosage/pattern for the exposure with respect to a simple single layer case. For a sensor that uses radiation to measure (such as an alignment sensor, a level sensor, an overlay, CD, etc. metrology system, etc.), the detected spectral profile of the radiation can be significantly different from a calibrated illumination spectral profile using a simple single layer stack, leading to accuracy errors.

Figure 13:
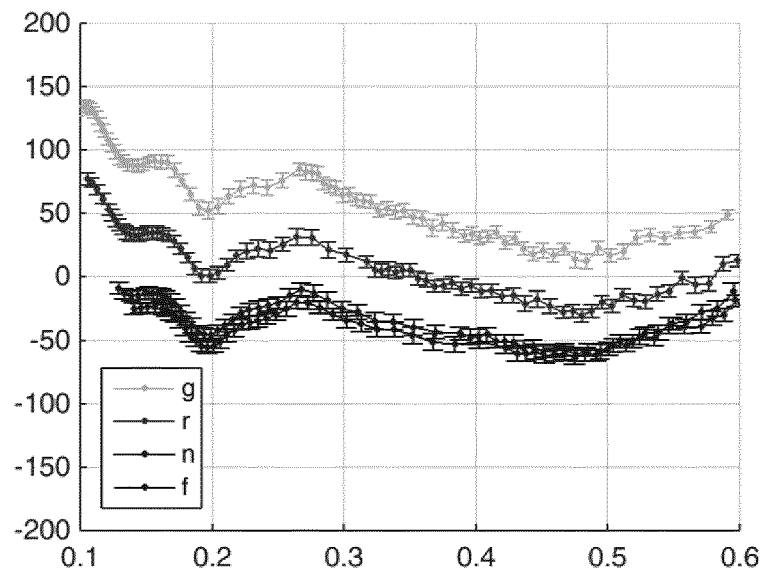
FIG. 13 is an example graph of calculated expected alignment as a function of the numerical aperture of the optics (of an optical sensor system) receiving radiation from a measurement mark on a substrate.

An example of the accuracy error of an alignment sensor induced by a substrate processed in a patterning process is described below. The alignment sensor's function is to measure the lateral position of an alignment mark. However, due to, e.g., aberrations in the alignment sensor, different wavelengths and angles through the optical elements of the alignment sensor result in computation of different aligned positions as shown in FIG. 13. In FIG. 13, the calculated expected alignment in nanometers is shown on the vertical axis as a function of numerical aperture of the alignment sensor for each of a plurality of different wavelengths (g, r, n and f correspond to different wavelengths). Although desirably the calculated expected alignment should be zero for each wavelength at all numerical aperture, it can be seen that the expected alignment can be, for example, different for different wavelengths at a same numerical aperture and be different for a same wavelength for different numerical apertures. So, calibrations can be performed on fiducial marks or calibration substrates in order to correct for such optical aberrations in the alignment sensor module.

Figure 14:
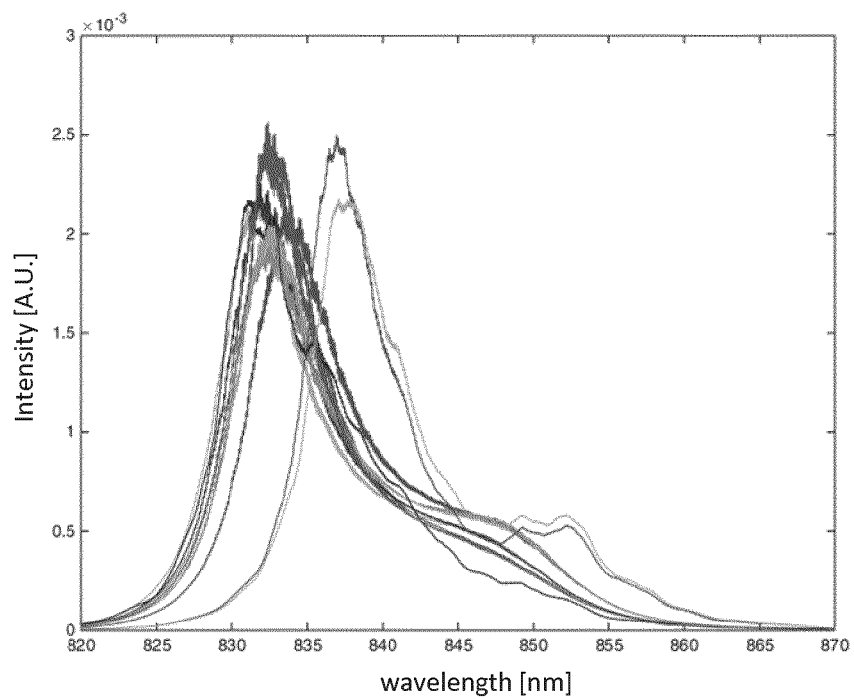
FIG. 14 is an example graph of the output intensity spectrum of various illumination sources.

However, any change in the detected wavelengths or angles diffracted from the alignment mark will effectively lead to measurements in an uncalibrated state. For example, FIG. 14 illustrates example output intensity spectrums for ten illumination sources used to provide a particular far infrared measurement wavelength, one or more of which can be used in an alignment sensor to provide a far infrared alignment measurement beam. The vertical axis shows the intensity in arbitrary units and the horizontal axis shows the wavelengths output by the sources. As seen in FIG. 14, the sources have a relatively wide spectral bandwidth. Thus, when combining this illumination spectrum with the spectral response swing curves for a substrate of a particular patterning process such as shown in FIG. 11, it can be intuitively seen that the detected spectrum will be different from the illumination spectrum, which yields a process induced accuracy error.

So, to account for the patterning process, testing using a substrate as created by the patterning process can be performed, for example, during component (e.g., alignment sensor) design and/or for performance testing of the applicable component. That is the process induced accuracy error can be measured.

To do so, process substrates throughout the product development lifecycle would typically be needed to design robust solutions to diverse instances of the substrates within the patterning process. But, these product substrates can be expensive, time consuming, and complex to manufacture. Further, there can be a logistical complexity and cost of getting product substrates to measure (e.g., gathering, tracking and shipping intermediate and/or final versions of product substrates). Further, there are issues of intellectual property preservation. For example, where testing is performed by someone other than the product manufacturer, the product manufacturer may be reluctant to share manufactured intermediate or final substrates, let alone how the product is made such as details regarding materials, layer thicknesses, etc., for fear of exposing their intellectual property and to maintain a competitive advantage to their competitors. So, this testing may typically be at the end of the patterning process development lifecycle, which increases the patterning process development time and cost and reduces flexibility.

So, in an embodiment, there is provided a product test substrate that can mimic or replicate behavior of a product substrate when exposed to radiation by a component (e.g., a metrology system, a projection system of lithographic apparatus, etc.). So, in an embodiment, the product test substrate can identify some of the challenges presented by product substrates. This can be useful by identifying such challenges earlier in the product lifecycle. This can be useful to improving the on-process performance of the component (e.g., a metrology system).

As seen in FIGS. 11 and 12, the process effect often correlates with the slope of the swing curves. Therefore, a swing curve with a large slope can be particularly troublesome. For example, as seen in FIG. 11, a large slope at an applicable nominal working radiation wavelength can be troublesome because any relatively small variation in wavelength from the nominal working radiation wavelength leads to a significant change in, e.g., intensity. Further, as seen in FIG. 12, the accuracy error can additionally or alternatively change due to a change in the substrate stack (e.g., a process variation that results in a difference within the stack from the design such as a change in material composition, a change in layer thickness, etc.). The change in the substrate stack can be intra-substrate change in, for example, the thickness of one or more layers and/or an inter-substrate (i.e., substrate to substrate) change in, for example, the thickness of one or more layers. Further, a change in the optical aberrations between instances of the applicable component (e.g., between different sensor system) can be lead to component-to-component accuracy differences on a same process substrate.

So, in an embodiment, there is provided a product test substrate wherein an optical response characteristic of the product test substrate has a relatively high non-zero sensitivity to a change in a characteristic of the incident radiation on the product test substrate. That is, the optical response characteristic has at least a non-zero change with respect to a change in the characteristic of the incident radiation. In an embodiment, the optical response characteristic of the product test substrate is intensity and/or diffraction efficiency. For example, intensity or diffraction efficiency of diffractive $1^{st}$ order radiation. In an embodiment, the characteristic of the incident radiation is radiation wavelength, incident angle of the radiation, polarization of the radiation and/or phase of the radiation beam. In other words, the product test substrate, when illuminated with radiation of a certain value of a characteristic (e.g., the wavelength of the radiation beam, the polarization of the radiation beam, the phase of the radiation beam, the intensity distribution (i.e., angular or spatial intensity distribution) of the radiation beam, the incident angle of the radiation beam on the substrate, etc.) of that radiation, would realize a relatively large slope at that certain value of the characteristic on a swing curve, for that product test substrate, of an optical response characteristic (such as intensity) against the characteristic of the radiation. In an embodiment, at least part of the swing curve for the product test substrate is has a non-zero slope. In an embodiment, at least part of the swing curve for the product test substrate is non-linear.

In an embodiment, the product test substrate has the relatively high sensitivity at one or more nominal characteristics (e.g., wavelengths) of the radiation provided by the component on the product test substrate (and on product substrates). So, for example, an alignment sensor system can be configured to provide radiation at 4 nominal wavelengths (although as will be appreciated the alignment sensor system could provide fewer or more wavelengths). And, so, the product test substrate is configured to provide the relatively high sensitivity at one or more of those wavelengths when illuminated by the alignment sensor system at those one or more wavelengths. Of course, if there are provided a plurality of such high sensitivities, they do not need to each have a same value.

In an embodiment, the sensitivity can be considered as a slope of the swing curve. In an embodiment, the sensitivity can be represented in terms of % change in intensity per unit wavelength and in an embodiment, has a value of 0.25%/nm or greater, of 0.5%/nm or greater, of 0.75%/nm or greater or 1%/nm or greater; a typical value can be selected from 0.25%/nm to 1%/nm. In an embodiment, the sensitivity can be a value of swing curve slope of 0.25 or greater (e.g., about 14° or greater), of 0.5 or greater (e.g., about 25° of greater), of 0.75 or greater (e.g., about 36° of greater) or of 1 or greater (e.g., about 45° of greater). In an embodiment, the substrate can have angular sensitivity. Angular slope can be expressed in terms of the angular reflectivity change (e.g., in %) per unit angle (e.g., degrees). In an embodiment, the angular reflectivity have a value greater than or equal to 1%/degree and a typical angular slope can have a value selected from the range of 1%/degree to 6%/degree. In an embodiment, the sensitivity can be considered as an error per unit slope (for example, 1 nm aberration error per 1% slope). The sensitivity in this context can be selected from the range of 0-5 nm error per unit slope.

In an embodiment, the product test substrate can be relatively easily and/or quickly manufactured. In an embodiment, the product test substrate stack doesn't have any device structures therein. Thus, the substrate can have an advantage of not containing proprietary information and therefore presents no intellectual property risk. In an embodiment, the product test substrate stack is constructed of only one or more planar layers or of only one or more planar layers below a pattern at the top of the stack.

Further, as noted above, one of the root causes of process effects comes from a large slope in a process swing curve. So, the product test substrate can be produced to effectively realize a large slope in the swing curve at one or more incident radiation characteristics (e.g., wavelength) of interest. In an embodiment, the product test substrate can be created so as to tune the swing curve for the desired application so as to realize a large slope at particular set of conditions.

In an embodiment, the product test substrate is fabricated using a process track of a lithocell. An advantage of using a track to build the process test substrate is in the speed and/or efficiency of producing the substrate. So, an embodiment of the product test substrate can be made on a commercial process track and so any factory that has a track could make the product test substrate.

In an embodiment, the product test substrate is fabricated without any etching steps. In an embodiment, the product test substrate stack comprises one or more layers created by spin coating so that the thickness of the one or more layers can be controlled by the spin speed during deposition.

In an embodiment, the product test substrate is fabricated using one or more materials that crosslink after baking and developing. In an embodiment, the product test substrate stack comprises one or more layers of spin-on-carbon (SoC) and/or spin-on-glass (SoG). In an embodiment, the product test substrate stack comprises one or more resists.

In an embodiment, the product test substrate has 20 layers or less. In an embodiment, the product test substrate is made in 4 or less process steps (e.g., coating, deposition, pattern transfer and development). In an embodiment, a pattern for measurement on the product test substrate does not have features smaller than about 500 nm, smaller than about 800 nm or smaller than about 1000 nm.

In an embodiment, the product test substrate is simple compared to a product substrate and thus can be relatively inexpensive to produce. Moreover, in an embodiment, the product test substrate can be recycled multiple times by, e.g., stripping all or part of the stack.

Figure 15A:
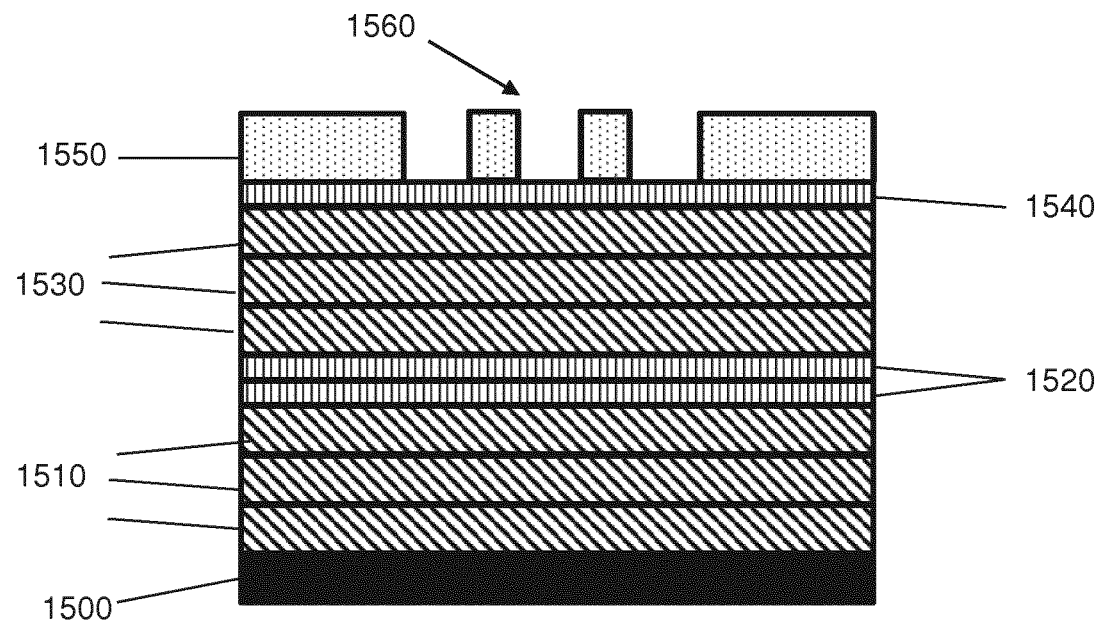
FIG. 15A is a schematic depiction of the stack of an embodiment a product test substrate.

FIG. 15A is a schematic depiction of the stack of an embodiment a product test substrate. The product test substrate comprises a base substrate 1500 with a plurality of layers overlying the base substrate 1500. In an embodiment, there is provided one or more layers 1510 of a particular material. In the example of FIG. 15A, there is provided 3 layers, although a single or other number of layers can be provided. In an embodiment, the one or more layers 1510 comprise spin-on-carbon. In an embodiment, each of the layers 1510 is in the range of 75-100 nm thick, thus 225-300 nm total thickness in this example.

Overlying one or more layers 1510 is one or more layers 1520 of a particular material different than the material of one or more layers 1510. In the example of FIG. 15A, there is provided 2 layers, although a single or other number of layers can be provided. In an embodiment, the one or more layers 1520 comprise spin-on-glass. In an embodiment, each of the layers 1520 is in the range of 20-40 nm thick, thus 40-80 nm total thickness in this example.

In an embodiment, there is provided one or more layers 1530 of a particular material overlying one or more layers 1520. In the example of FIG. 15A, there is provided 3 layers, although a single or other number of layers can be provided. In an embodiment, the one or more layers 1530 comprise spin-on-carbon. In an embodiment, each of the layers 1530 is in the range of 75-100 nm thick, thus 225-300 nm total thickness in this example.

In an embodiment, there is provided one or more layers 1540 of a particular material overlying the one or more layers 1530. In the example of FIG. 15A, there is provided 1 layer, although another number of layers can be provided. In an embodiment, the one or more layers 1540 comprise spin-on-glass. In an embodiment, each of the layers 1540 is in the range of 20-40 nm thick, thus 20-40 nm total thickness in this example.

In an embodiment, there may not be provided any further layers, thus leaving a flat top surface. Such a product test substrate could be used with, e.g., a level sensor system. In an embodiment, there may be provided a layer 1550 of resist overlying the one or more layers 1540. In an embodiment, the layer 1550 is in the range of 100-300 nm thick or in the range of 5-35 nm thick. In an embodiment, the resist layer 1550 could have a flat top surface. Such a product test substrate could be used with, e.g., a level sensor system and/or a projection system of a lithographic apparatus. In this embodiment for, e.g., an alignment measurement system, there is provided a pattern 1560 formed in a layer 1550. In this example, the layer is a resist layer, but could be a different material. In an embodiment, one or more of layers 1500-1540 can comprise a pattern so that overlay can be measured.

Figure 15B:
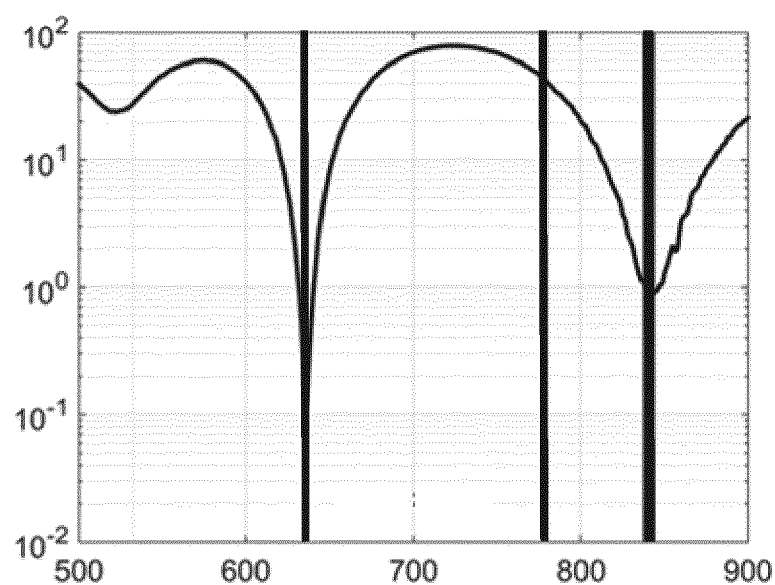
FIG. 15B is an example graph of diffraction efficiency for the product test substrate of FIG. 15A as a function of incident radiation wavelength.

FIG. 15B is an example graph of diffraction efficiency in percentage for the product test substrate of FIG. 15A as a function of incident radiation wavelength in nm (i.e., a swing curve for the product test substrate). As seen in FIG. 15B, the swing curve of the product test substrate is not linear or substantially linear. Rather, the swing curve is non-linear. In an embodiment, the swing curve has one or more dips (such as shown at about 634 nm and about 840 nm).

Moreover, as shown in FIG. 15B, the swing curve has a relatively high steep slope at one or more wavelengths of interest. Thus, an optical response characteristic of the product test substrate has a relatively high sensitivity to a change in a characteristic of the incident radiation on the product test substrate at one or more wavelengths of interest. In the case of FIG. 15B, the swing curve has a steep slope at wavelengths of interest of about 634 nm, 780 nm and 840 nm. In an embodiment, the wavelengths of interest are measurement wavelengths produced by a metrology system (such as an alignment measurement system).

Figure 16A:
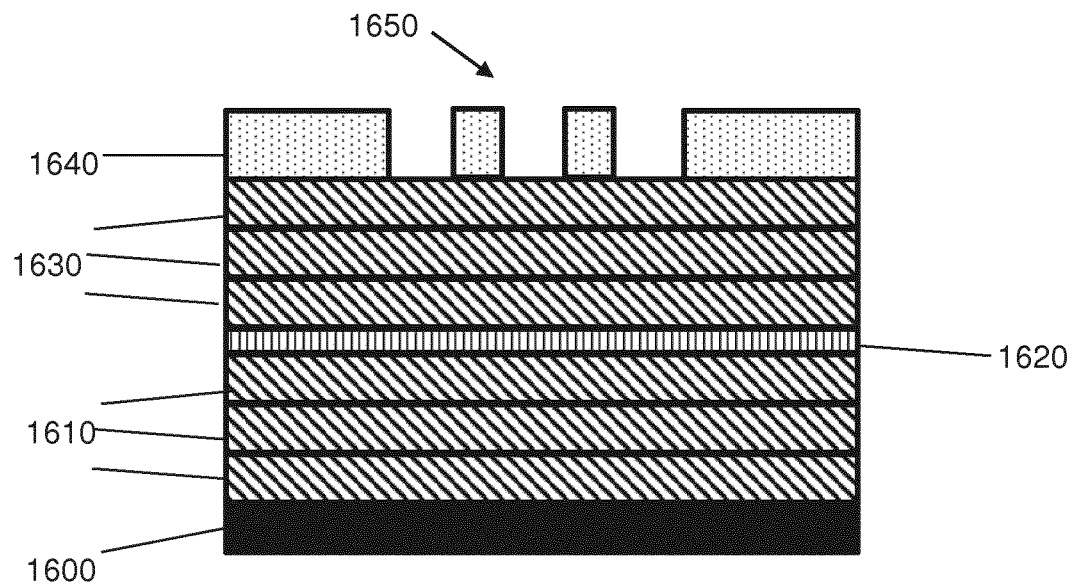
FIG. 16A is a schematic depiction of the stack of an embodiment a product test substrate.

FIG. 16A is a schematic depiction of the stack of a further embodiment a product test substrate. The product test substrate comprises a base substrate 1600 with a plurality of layers overlying the base substrate 1600. In an embodiment, there is provided one or more layers 1610 of a particular material. In the example of FIG. 16A, there is provided 3 layers, although a single or other number of layers can be provided. In an embodiment, the one or more layers 1610 comprise spin-on-carbon. In an embodiment, each of the layers 1610 is in the range of 75-100 nm thick, thus 225-300 nm total thickness in this example.

Overlying one or more layers 1610 is one or more layers 1620 of a particular material different than the material of one or more layers 1610. In the example of FIG. 16A, there is provided 1 layer, although another number of layers can be provided. In an embodiment, the one or more layers 1620 comprise spin-on-glass. In an embodiment, each of the layers 1620 is in the range of 20-40 nm thick, thus 20-40 nm total thickness in this example.

In an embodiment, there is provided one or more layers 1630 of a particular material overlying one or more layers 1620. In the example of FIG. 16A, there is provided 3 layers, although a single or other number of layers can be provided. In an embodiment, the one or more layers 1630 comprise spin-on-carbon. In an embodiment, each of the layers 1630 is in the range of 75-100 nm thick, thus 225-300 nm total thickness in this example.

In an embodiment, there may not be provided any further layers, thus leaving a flat top surface. Such a product test substrate could be used with, e.g., a level sensor system. In an embodiment, there may be provided a layer 1640 of resist overlying the one or more layers 1630. In an embodiment, the layer 1640 is in the range of 100-300 nm thick or 5-35 nm thick. In an embodiment, the resist layer 1640 could have a flat top surface. Such a product test substrate could be used with, e.g., a level sensor system and/or a projection system of a lithographic apparatus. In this embodiment for, e.g., an alignment measurement system, there is provided a pattern 1650 formed in a layer 1640. In this example, the layer is a resist layer, but could be a different material. In an embodiment, one or more of layers 1600-1630 can comprise a pattern so that overlay can be measured.

Figure 16B:
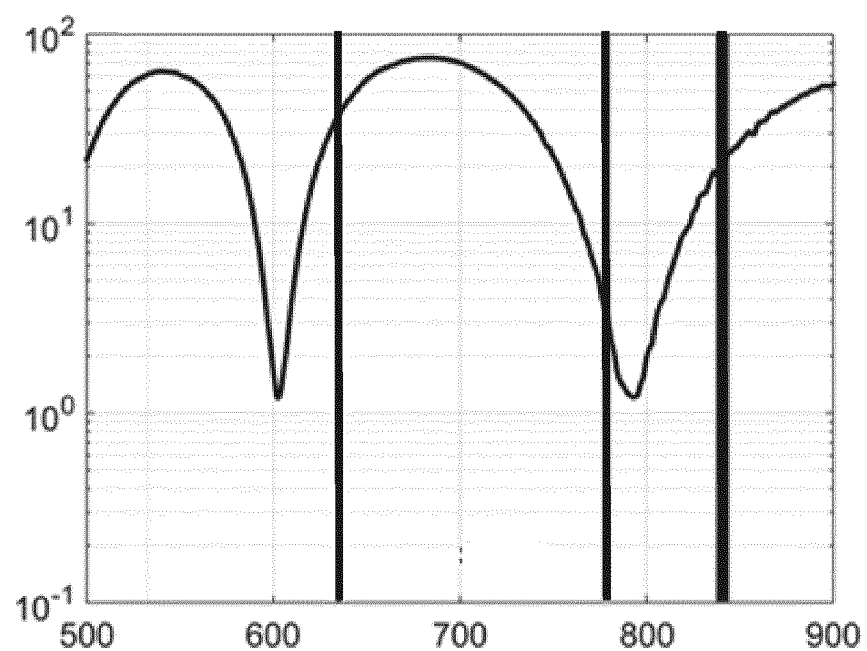
FIG. 16B is an example graph of diffraction efficiency for the product test substrate of FIG. 16A as a function of incident radiation wavelength.

FIG. 16B is an example graph of diffraction efficiency in percentage for the product test substrate of FIG. 16A as a function of incident radiation wavelength in nm (i.e., a swing curve for the product test substrate). As seen in FIG. 16B, the swing curve of the product test substrate is not linear or substantially linear. Rather, the swing curve is non-linear. In an embodiment, the swing curve has one or more dips (such as shown at about 600 nm and about 795 nm).

Moreover, as shown in FIG. 16B, the swing curve has a relatively high steep slope at one or more wavelengths of interest. Thus, an optical response characteristic of the product test substrate has a relatively high sensitivity to a change in a characteristic of the incident radiation on the product test substrate at one or more wavelengths of interest. In the case of FIG. 16B, the swing curve has a steep slope at wavelengths of interest of about 634 nm, 780 nm and 840 nm. In an embodiment, the wavelengths of interest are measurement wavelengths produced by a metrology system (such as an alignment measurement system). As compared to FIG. 15B, it can be seen that the swing curve of FIG. 16B enables providing different slopes at the different wavelengths of interest and thus provide a sensitivity/slope specific for a particular application. For example, in the example of FIG. 16, the product test substrate has a higher sensitivity to a change in a characteristic of the incident radiation on the product test substrate at about 780 nm compared to the product test substrate of FIG. 15.

Figure 17:
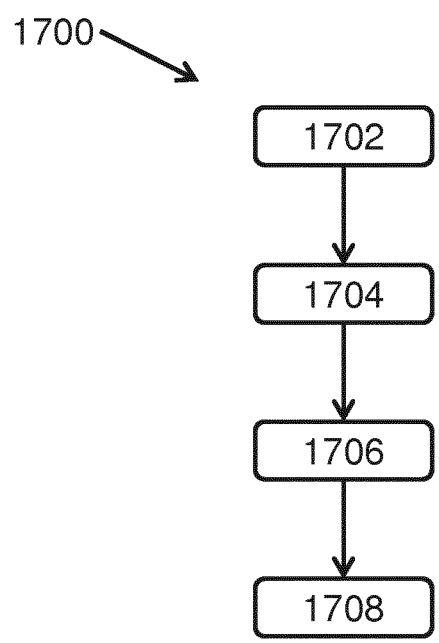
FIG. 17 is an example flow chart of a method creating a product test substrate.

FIG. 17 is a flow chart of an example method 1700 of creating a product test substrate. At 1702, a first layer of material is provided (e.g., deposited by a deposition technique, spun on, etc.) on a substrate base. In an embodiment, the substrate base is a silicon wafer. In an embodiment, the first layer of material comprises a plurality of sub-layers of the material, e.g., 2 to 20 sub-layers.

In a first type of the product test substrate, the first layer of material comprises carbon containing material. In an embodiment, the material of the first layer comprises spin-on carbon. In an embodiment, the first layer comprises a plurality of spin-on carbon layers. In an embodiment, the first layer of material is selected from the range of 600 nm to 1200 nm.

In a second type of the product test substrate, the first layer of material comprises silicon dioxide. In an embodiment, the first layer comprises a plurality of spin-silicon dioxide layers. In an embodiment, the first layer of material is selected from the range of 300 nm to 1500 nm.

At 1704, a second layer of material is provided (e.g., deposited by a deposition technique, spun on, etc.) on the first layer of material. In an embodiment, the second layer of material comprises a plurality of sub-layers of the material, e.g., 2 to 20 sub-layers.

In the first type of the product test substrate, the second layer of material comprises a glass containing material. In an embodiment, the material of the second layer comprises spin-on glass. In an embodiment, the second layer comprises a plurality of spin-on glass layers. In an embodiment, the second layer of material is selected from the range of 10 nm to 300 nm.

In the second type of the product test substrate, the second layer of material comprises hafnium dioxide. In an embodiment, the second layer comprises a plurality of hafnium dioxide layers. In an embodiment, the second layer of material is selected from the range of 10 nm to 300 nm.

In an embodiment, the material of the second layer can be that of the first layer and the material of the first layer can be that of the second layer.

In an optional step 1706, a third layer of material is provided (e.g., deposited by a deposition technique, spun on, etc.) on the second layer of material. In an embodiment, the third layer of material comprises a plurality of sub-layers of the material, e.g., 2 to 20 sub-layers. In an embodiment, the third layer of material is the same as that of the first layer of material.

In the first type of the product test substrate, the third layer of material comprises carbon containing material. In an embodiment, the material of the third layer comprises spin-on carbon. In an embodiment, the third layer comprises a plurality of spin-on carbon layers. In an embodiment, the third layer of material is selected from the range of 600 nm to 1200 nm.

In an embodiment, the first, second and/or third layers can be produced in a traditional track system without requiring development and/or etching. In an embodiment, the product test substrate is produced without using any etching, ion implantation, and/or chemical mechanical planarization.

In an embodiment, the first, second and optional third layers together produce a layer with relatively high flatness. For example, layer flatness of less than or equal to 10 nm or less than or equal to 5 nm.

In an optional step 1708, a layer of resist can be provided. In an embodiment, the layer of resist can be provided with a pattern, e.g., a metrology mark pattern. In an embodiment, the pattern is produced by illuminating the resist with radiation from a component being evaluated. In an embodiment, the pattern is a developed resist. In an embodiment, the pattern is an overlay metrology mark with overlying patterns in two different layers. In that case, the underlying pattern can be created in the second or optional third layer or created in a layer provided above the second or optional third layer.

As described above, the thicknesses and/or materials of the layers are selected to exhibit a swing curve with a desired sensitivity at one or more wavelengths of interest. For example, the swing curve can be steep (e.g., 5-20% slope) with a low first order diffraction efficiency/intensity (e.g., less than or equal to 30%, less than or equal to 10%, or less than or equal to 1%) at one or more certain wavelengths of interest in, e.g., the red (~620-680 nm) and the near infrared (~750-900 nm) bandwidths.

In an embodiment, an optical simulation tool can be used to select the materials (e.g., material types, refractive indexes, etc.), the thicknesses of the materials, etc. to obtain a custom radiation field that would have a swing curve with the desired profile.

Figure 18:
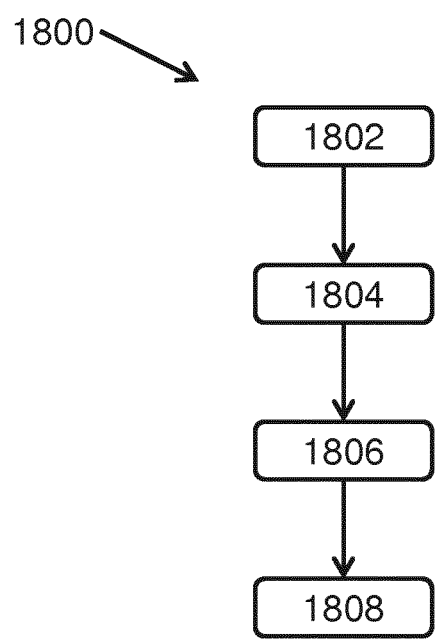
FIG. 18 is an example flow chart of a method of using the product test substrate.

FIG. 18 is a flow chart of an example method 1800 of using a product test substrate as described herein.

At 1802, a product test substrate as described herein is illuminated with radiation from a component, such as projection system of a lithographic apparatus, a metrology tool (e.g., a level sensor of a lithographic apparatus, an alignment sensor of a lithographic apparatus, a metrology tool outside of the lithographic apparatus, etc.).

At 1804, the radiation redirected by the illuminated product test substrate is detected. A parameter value (e.g., an intensity value, a diffraction efficiency, etc.) is determined from the detected radiation.

At 1806, the parameter value is processed to make a determination with respect to the component. For example, the parameter value can be determined for a bare substrate illuminated by the component and then determined for the product test substrate illuminated by the same component. In an embodiment, the parameter value can be determined for the bare substrate for a plurality of wavelengths to find a difference between the parameter values for the different wavelengths. Similarly, the parameter value can be determined for the product test substrate for the plurality of wavelengths to find a difference between the parameter values for the different wavelengths. Then the determined differences for the bare substrate and for the product test substrate can be compared to determine an effect by the component (and for which an action can be taken as described herein).

In an embodiment, for evaluating a level sensor, a bare substrate with a same height as the product test substrate can be illuminated by the level sensor and then a difference in parameter value can be used to determine an effect by product test substrate on the level sensor (and for which an action can be taken as described herein).

In an embodiment, a swing curve can be determined for the product test substrate illuminated by a component being analyzed and an effect by the component can be determined from the swing curve (e.g., by comparing with a simulated swing curve for the product test substrate if illuminated with an ideal component).

In an embodiment, a plurality of different product test substrates can be illuminated by a component, wherein each product test substrate has a different swing curve representing, for example, a certain percentage change of one or more variables in a process involving illumination by the component. The measured different product test substrates can then be analyzed to assess the robustness of, e.g., the component to a change in the process.

In an embodiment, a metrology tool (e.g., a diffraction-based overlay or CD metrology tool, a level sensor, an alignment sensor, etc.) can use certain measurement radiation wavelengths (e.g., 4 or more operational wavelengths) for measurement. So, a user may want to determine the "best" wavelength for use in measurement, wherein "best" can be the wavelength that gives the most accurate result (or least is more accurate than another wavelength), can be the wavelength that is the most robust to process effects (or at least more robust to process effects than another wavelength), etc. So, in an embodiment, one or more product test substrates are produced to have regions, each having a test structure, with similar swing curve slopes or slope ranges (e.g., 0.25%/nm to 1%/nm) for each of the operational radiation wavelengths. Then, by measuring the test structures' response to that range, the user can determine which radiation wavelength is the least sensitive (or at least less sensitive than another wavelength) to the slope range. That wavelength can then be expected to give a better measurement result in terms of, e.g., robustness to process change and/or accuracy. In an embodiment, the test structures' response can be evaluated by comparing a parameter determined using the test structures to that known for a reference test structure (e.g., a fiducial on a bare substrate). The comparison can be made using the same wavelength from which the reference test structure yields the known parameter or can be made on wavelength to wavelength basis where each wavelength should yield the same known parameter.

In further embodiment, a user may wish to design, setup, etc. a metrology apparatus with an optimum robustness to process effects. So, in an embodiment, a collection of product test substrates can be created which are similar or exaggerate a challenging characteristic (e.g., layer thickness change, measurement radiation wavelength change, angular change, etc.) and then modify and test various metrology apparatus design, setup, etc. considerations in order to reduce or minimize the process effects and yield a more robust metrology apparatus.

So, in an embodiment, a parameter measured by a metrology tool (e.g., overlay or CD by a diffraction-based metrology tool, a height/orientation/focus by a level sensor tool, alignment/displacement by an alignment sensor, etc.) can be affected by swing curves. So, the product test substrate can be used to assess the robustness of the metrology by those metrology tools by measuring and comparing targets on a relatively simple product test substrate.

At 1808, an action is taken based on the parameter value. For example, the action can comprise configuring a patterning process (e.g., changing a setting of an apparatus in the patterning process) used to pattern device product substrates. As another example, the action can comprise changing a setting of the component. As another example, the action can comprise designating the component as not suitable for use or causing repair or replacement of the component.

So, as described herein, there is described an innovative product test substrate that has a swing curve desirable for, e.g., performance testing and/or calibration. Further, as described herein, there also provide innovative process for constructing such a product test substrate and a method of using such a product test substrate.

In an embodiment, there is provided a method comprising: illuminating a product test substrate with radiation from a component, wherein the product test substrate does not comprise a device pattern etched therein and yields a non-zero sensitivity when illuminated, the non-zero sensitivity representing a change in an optical response characteristic of the product test substrate with respect to a change in a characteristic of the radiation; measuring at least a part of the radiation redirected by the product test substrate to determine a parameter value; and taking an action with respect to the component based on the parameter value.

In an embodiment, a swing curve for the product test substrate of the optical response characteristic in relation to the characteristic of the radiation has a non-linear portion. In an embodiment, the optical response characteristic comprises diffraction efficiency and/or intensity. In an embodiment, the characteristic comprises radiation wavelength, radiation polarization, radiation phase and/or incident angle of the radiation on the product test substrate. In an embodiment, the product test substrate comprises at least two generally planar layers of different materials and has a pattern therein. In an embodiment, the characteristic of the radiation is wavelength and wherein a swing curve for the product test substrate represented in terms of intensity as a percentage versus wavelength in terms of nanometers has a slope of 0.25%/nm or greater for a certain value of interest of the wavelength. In an embodiment, the product test substrate yields a first non-zero sensitivity for a certain first value of interest of the characteristic of the radiation and a second non-zero sensitivity for a certain second value of interest of the characteristic of the radiation, the second value of interest of the characteristic of the radiation being different than the first value of interest of the characteristic of the radiation. In an embodiment, the action comprises configuring a patterning process used to pattern device product substrates. In an embodiment, the action comprises changing a setting of the component or designating the component as not suitable for use.

In an embodiment, there is provided a method comprising: calculating an optical response for a product test substrate illuminated by radiation in order to determine one or more physical characteristics of the product test substrate that would yield a non-zero sensitivity when illuminated, the non-zero sensitivity representing a change in an optical response characteristic of the product test substrate with respect to a change in a characteristic of the radiation; and generating electronic instructions comprising the one or more physical characteristic to generate the product test substrate.

In an embodiment, the method further comprises producing the product test substrate to have the one or more physical characteristics. In an embodiment, the product test substrate does not comprise a device pattern etched therein. In an embodiment, the optical response characteristic comprises diffraction efficiency and/or intensity. In an embodiment, the characteristic comprises radiation wavelength, radiation polarization, radiation phase and/or incident angle of the radiation on the product test substrate. In an embodiment, the product test substrate comprises at least two generally planar layers of different materials and has a pattern therein. In an embodiment, the one or more physical characteristics are such that the product test substrate yields a first non-zero sensitivity for a certain first value of interest of the characteristic of the radiation and a second non-zero sensitivity for a certain second value of interest of the characteristic of the radiation, the second value of interest of the characteristic of the radiation being different than the first value of interest of the characteristic of the radiation. In an embodiment, the characteristic of the radiation is wavelength and wherein a swing curve for the product test substrate represented in terms of intensity as a percentage versus wavelength in terms of nanometers has a slope of 0.25%/nm or greater for a certain value of interest of the wavelength.

In an embodiment, there is provided a product test substrate for illumination with radiation from a component, wherein the product test substrate does not comprise a device pattern etched therein and yields a non-zero sensitivity when illuminated, the non-zero sensitivity representing a change in an optical response characteristic of the product test substrate with respect to a change in a characteristic of the radiation.

In an embodiment, the product test substrate comprises at least two generally planar layers of different materials and has a pattern therein. In an embodiment, a swing curve for the product test substrate of the optical response characteristic in relation to the characteristic of the radiation has a non-linear portion. In an embodiment, the optical response characteristic comprises diffraction efficiency and/or intensity. In an embodiment, the characteristic comprises radiation wavelength, radiation polarization, and/or incident angle of the radiation on the product test substrate. In an embodiment, the product test substrate yields a first non-zero sensitivity for a certain first value of interest of the characteristic of the radiation and a second non-zero sensitivity for a certain second value of interest of the characteristic of the radiation, the second value of interest of the characteristic of the radiation being different than the first value of interest of the characteristic of the radiation. In an embodiment, the characteristic of the radiation is wavelength and wherein a swing curve for the product test substrate represented in terms of intensity as a percentage versus wavelength in terms of nanometers has a slope of 0.25%/nm or greater for a certain value of interest of the wavelength.

Figure 19:
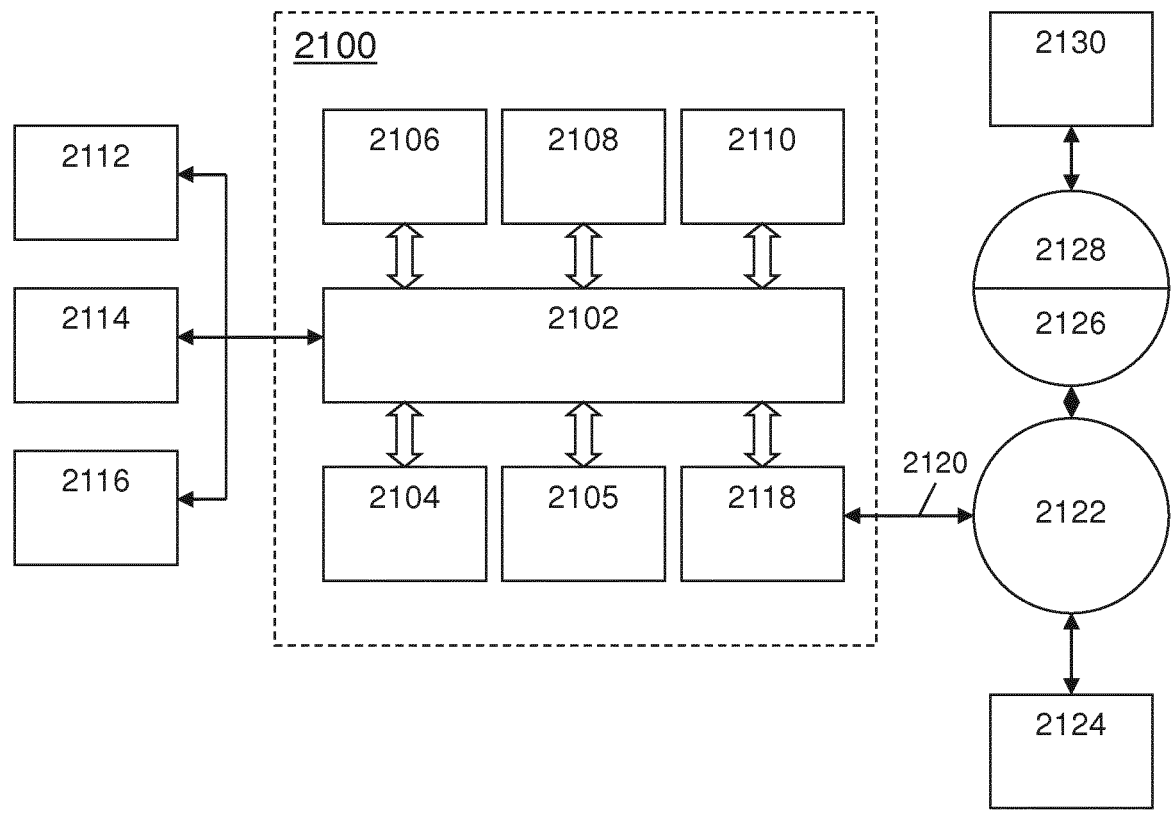
FIG. 19 schematically depicts a computer system which may implement embodiments of this disclosure.

Referring to FIG. 19, a computer system 2100 is shown. The computer system 2100 includes a bus 2102 or other communication mechanism for communicating information, and a processor 2104 (or multiple processors 2104 and 2105) coupled with bus 2102 for processing information. Computer system 2100 also includes a main memory 2106, such as a random access memory (RAM) or other dynamic storage device, coupled to bus 2102 for storing information and instructions to be executed by processor 2104. Main memory 2106 also may be used for storing temporary variables or other intermediate information during execution of instructions to be executed by processor 2104. Computer system 2100 further includes a read only memory (ROM) 2108 or other static storage device coupled to bus 2102 for storing static information and instructions for processor 2104. A storage device 2110, such as a magnetic disk or optical disk, is provided and coupled to bus 2102 for storing information and instructions.

Computer system 2100 may be coupled via bus 2102 to a display 2112, such as a cathode ray tube (CRT) or flat panel or touch panel display for displaying information to a computer user. An input device 2114, including alphanumeric and other keys, is coupled to bus 2102 for communicating information and command selections to processor 2104. Another type of user input device is cursor control 2116, such as a mouse, a trackball, or cursor direction keys for communicating direction information and command selections to processor 2104 and for controlling cursor movement on display 2112. This input device typically has two degrees of freedom in two axes, a first axis (e.g., x) and a second axis (e.g., y), that allows the device to specify positions in a plane. A touch panel (screen) display may also be used as an input device.

The computer system 2100 may be suitable to function as a processing unit herein in response to processor 2104 executing one or more sequences of one or more instructions contained in main memory 2106. Such instructions may be read into main memory 2106 from another computer-readable medium, such as storage device 2110. Execution of the sequences of instructions contained in main memory 2106 causes processor 2104 to perform a process described herein. One or more processors in a multi-processing arrangement may also be employed to execute the sequences of instructions contained in main memory 2106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 2104 for execution. Such a medium may take many forms, including but not limited to, non-volatile media, volatile media, and transmission media. Non-volatile media include, for example, optical or magnetic disks, such as storage device 2110. Volatile media include dynamic memory, such as main memory 2106. Transmission media include coaxial cables, copper wire and fiber optics, including the wires that comprise bus 2102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 2104 for execution. For example, the instructions may initially be borne on a magnetic disk of a remote computer. The remote computer can load the instructions into its dynamic memory and send the instructions over a telephone line using a modem. A modem local to computer system 2100 can receive the data on the telephone line and use an infrared transmitter to convert the data to an infrared signal. An infrared detector coupled to bus 2102 can receive the data carried in the infrared signal and place the data on bus 2102. Bus 2102 carries the data to main memory 2106, from which processor 2104 retrieves and executes the instructions. The instructions received by main memory 2106 may optionally be stored on storage device 2110 either before or after execution by processor 2104.

Computer system 2100 may also include a communication interface 2118 coupled to bus 2102. Communication interface 2118 provides a two-way data communication coupling to a network link 2120 that is connected to a local network 2122. For example, communication interface 2118 may be an integrated services digital network (ISDN) card or a modem to provide a data communication connection to a corresponding type of telephone line. As another example, communication interface 2118 may be a local area network (LAN) card to provide a data communication connection to a compatible LAN. Wireless links may also be implemented. In any such implementation, communication interface 2118 sends and receives electrical, electromagnetic or optical signals that carry digital data streams representing various types of information.

Network link 2120 typically provides data communication through one or more networks to other data devices. For example, network link 2120 may provide a connection through local network 2122 to a host computer 2124 or to data equipment operated by an Internet Service Provider (ISP) 2126. ISP 2126 in turn provides data communication services through the worldwide packet data communication network, now commonly referred to as the "Internet" 2128. Local network 2122 and Internet 2128 both use electrical, electromagnetic or optical signals that carry digital data streams. The signals through the various networks and the signals on network link 2120 and through communication interface 2118, which carry the digital data to and from computer system 2100, are exemplary forms of carrier waves transporting the information.

Computer system 2100 can send messages and receive data, including program code, through the network(s), network link 2120, and communication interface 2118. In the Internet example, a server 2130 might transmit a requested code for an application program through Internet 2128, ISP 2126, local network 2122 and communication interface 2118. In accordance with one or more embodiments, one such downloaded application provides for a method as disclosed herein, for example. The received code may be executed by processor 2104 as it is received, and/or stored in storage device 2110, or other non-volatile storage for later execution. In this manner, computer system 2100 may obtain application code in the form of a carrier wave.

An embodiment of the disclosure may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may be made in this text to the use of a metrology apparatus in the manufacture of ICs, it should be understood that the metrology apparatus and processes described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or one or more various other tools. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example nanoimprint lithography, and where the context allows, is not limited to optical lithography. In the case of nanoimprint lithography, the patterning device is an imprint template or mold.

In the metrology apparatuses described herein, a substrate support may be provided to hold the substrate W during measurement operations. The substrate support may be similar or identical in form to the substrate table WT of FIG. 1. In an example where the metrology apparatus is integrated with the lithographic apparatus, it may even be the same substrate table. Coarse and fine positioners may be provided to accurately position the substrate in relation to a measurement optical system. Various sensors and actuators are provided for example to acquire the position of a target of interest, and to bring it into position under the objective lens. Typically many measurements will be made on targets at different locations across the substrate W. The substrate support can be moved in X and Y directions to acquire different targets, and in the Z direction to obtain a desired location of the target relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and only the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

References herein to crossing or passing a threshold may include something having a value lower than a specific value or lower than or equal to a specific value, something having a value higher than a specific value or higher than or equal to a specific value, something being ranked higher or lower than something else (through e.g., sorting) based on, e.g., a parameter, etc.

References herein to correcting or corrections of an error include eliminating the error or reducing the error to within a tolerance range.

The term "optimizing" and "optimization" as used herein refers to or means adjusting a lithographic apparatus, a patterning process, etc. such that results and/or processes of lithography or patterning processing have more a desirable characteristic, such as higher accuracy of projection of a design layout on a substrate, a larger process window, etc. Thus, the term "optimizing" and "optimization" as used herein refers to or means a process that identifies one or more values for one or more variables that provide an improvement, e.g. a local optimum, in at least one relevant metric, compared to an initial set of one or more values for those one or more variables. "Optimum" and other related terms should be construed accordingly. In an embodiment, optimization steps can be applied iteratively to provide further improvements in one or more metrics.

In an optimization process of a system, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system can be confined to finite ranges and/or be interdependent due to practicalities of implementations of the system or process. In the case of a lithographic apparatus or patterning process, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

While specific embodiments of the disclosure have been described above, it will be appreciated that the disclosure may be practiced otherwise than as described. For example, the disclosure may take the form of a computer program containing one or more sequences of machine-readable instructions describing a method as disclosed above, or a data storage medium (e.g. semiconductor memory, magnetic or optical disk) having such a computer program stored therein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The descriptions above are intended to be illustrative, not limiting. Thus, it will be apparent to one skilled in the art that modifications may be made to the disclosure as described without departing from the scope of the claims set out below.

The invention claimed is:

1. A method comprising:
   illuminating a product test substrate with radiation from a component, the radiation comprising one or more predetermined values of a characteristic of the radiation, wherein:
      the product test substrate does not comprise a device pattern etched therein and yields a non-zero sensitivity when illuminated at the one or more predetermined values of the characteristic of the radiation,
      the non-zero sensitivity represents a slope of a swing curve for the product test substrate indicating a change in an optical response characteristic of the product test substrate with respect to a change in the characteristic of the radiation, and
      the slope of the swing curve is higher at the one or more predetermined values of the characteristic of the radiation than at other values of the characteristic of the radiation;
   measuring at least a part of the radiation redirected by the product test substrate to determine a parameter value; and
   taking an action with respect to the component based on the parameter value.

2. The method of claim 1, wherein the swing curve for the product test substrate of the optical response characteristic in relation to the characteristic of the radiation has a non-linear portion.

3. The method of claim 1, wherein the optical response characteristic comprises diffraction efficiency.

4. The method of claim 1, wherein the characteristic of the radiation comprises radiation wavelength, radiation polarization, radiation phase and/or incident angle of the radiation on the product test substrate.

5. The method of claim 1, wherein:
   the characteristic of the radiation is wavelength,
   the swing curve for the product test substrate is represented in terms of intensity as a percentage versus wavelength in nanometers, and
   the slope of the swing curve is 0.25%/nm or greater for a certain value of interest of the wavelength.

6. The method of claim 1, wherein:
   the one or more predetermined values of the characteristic of the radiation comprise a first value of interest of the characteristic of the radiation and a second value of interest of the characteristic of the radiation, and
   the product test substrate yields a first non-zero sensitivity for the first value of interest of the characteristic of the radiation and a second non-zero sensitivity for the second value of interest of the characteristic of the radiation, the second value of interest of the characteristic of the radiation being different from the first value of interest of the characteristic of the radiation.

7. The method of claim 1, wherein the action comprises configuring a patterning process used to pattern device product substrates.

8. The method of claim 1, wherein the action comprises changing a setting of the component or designating the component as unsuitable for use.

9. A method comprising:
   calculating an optical response for a product test substrate illuminated by radiation at one or more predetermined values of a characteristic of the radiation in order to determine one or more physical characteristics of the product test substrate that would yield a non-zero sensitivity when illuminated at the one or more predetermined values of the characteristic of the radiation, wherein:
the non-zero sensitivity represents a slope of a swing curve for the product test substrate indicating a change in an optical response characteristic of the product test substrate with respect to a change in the characteristic of the radiation,
the slope of the swing curve is higher at the one or more predetermined values of the characteristic of the radiation than at other values of the characteristic of the radiation, and
the optical response characteristic comprises diffraction efficiency; and
generating electronic instructions comprising the one or more physical characteristics to generate the product test substrate.

10. The method of claim 9, further comprising producing the product test substrate to have the one or more physical characteristics.

11. The method of claim 9, wherein the product test substrate does not comprise a device pattern etched therein.

12. The method of claim 9, wherein the optical response characteristic further comprises intensity.

13. The method of claim 9, wherein the characteristic of the radiation comprises radiation wavelength, radiation polarization, radiation phase and/or incident angle of the radiation on the product test substrate.

14. The method of claim 9, wherein:
the one or more predetermined values of the characteristic of the radiation comprise a first value of interest of the characteristic of the radiation and a second value of interest of the characteristic of the radiation, and
the one or more physical characteristics are such that the product test substrate yields a first non-zero sensitivity for the first value of interest of the characteristic of the radiation and a second non-zero sensitivity for the second value of interest of the characteristic of the radiation, the second value of interest of the characteristic of the radiation being different than the first value of interest of the characteristic of the radiation.

15. The method of claim 9, wherein:
the characteristic of the radiation is wavelength,
the swing curve for the product test substrate is represented in terms of intensity as a percentage versus wavelength in terms of nanometers, and
the slope of the swing curve is 0.25%/nm or greater for a certain value of interest of the wavelength.

16. A product test substrate for illumination with radiation from a component, wherein the product test substrate:
lacks a device pattern etched therein; and
yields a non-zero sensitivity when illuminated at one or more predetermined values of a characteristic of radiation, the non-zero sensitivity representing a slope of a swing curve for the product test substrate indicating a change in an optical response characteristic of the product test substrate with respect to a change in the characteristic of the radiation, wherein the slope of the swing curve is higher at the one or more predetermined values of the characteristic of the radiation than at other values of the characteristic of the radiation.

17. The product test substrate of claim 16, wherein the swing curve for the product test substrate of the optical response characteristic in relation to the characteristic of the radiation has a non-linear portion.

18. The product test substrate of claim 16, wherein the optical response characteristic comprises diffraction efficiency.

19. The product test substrate of any of claim 16, wherein the characteristic of the radiation comprises radiation wavelength, radiation polarization, and/or incident angle of the radiation on the product test substrate.

20. The product test substrate of claim 16, wherein:
the one or more predetermined values of the characteristic of the radiation comprise a first value of interest of the characteristic of the radiation and a second value of interest of the characteristic of the radiation, and
the product test substrate yields a first non-zero sensitivity for the first value of interest of the characteristic of the radiation and a second non-zero sensitivity for the second value of interest of the characteristic of the radiation, the second value of interest of the characteristic of the radiation being different than the first value of interest of the characteristic of the radiation.

21. A metrology apparatus for measuring an object of a patterning process, the metrology apparatus configured to perform a method comprising:
illuminating a product test substrate with radiation from a component, the radiation comprising one or more predetermined values of a characteristic of the radiation, wherein:
the product test substrate does not comprise a device pattern etched therein and yields a non-zero sensitivity when illuminated at the one or more predetermined values of the characteristic of the radiation,
the non-zero sensitivity represents a slope of a swing curve for the product test substrate indicating a change in an optical response characteristic of the product test substrate with respect to a change in the characteristic of the radiation, and
the slope of the swing curve is higher at the one or more predetermined values of the characteristic of the radiation than at other values of the characteristic of the radiation;
measuring at least a part of the radiation redirected by the product test substrate to determine a parameter value; and
taking an action with respect to the component based on the parameter value.

22. A computer program product comprising a computer non-transitory readable medium having instructions recorded thereon, the instructions when executed by a computer implementing operations comprising:
illuminating a product test substrate with radiation from a component, the radiation comprising one or more predetermined values of a characteristic of the radiation, wherein:
the product test substrate does not comprise a device pattern etched therein and yields a non-zero sensitivity when illuminated at the one or more predetermined values of the characteristic of the radiation,
the non-zero sensitivity represents a slope of a swing curve for the product test substrate indicating a change in an optical response characteristic of the product test substrate with respect to a change in the characteristic of the radiation, and
the slope of the swing curve is higher at the one or more predetermined values of the characteristic of the radiation than at other values of the characteristic of the radiation;

measuring at least a part of the radiation redirected by the product test substrate to determine a parameter value; and taking an action with respect to the component based on the parameter value.

23. A system comprising:

a hardware processor system; and a non-transitory computer readable storage medium configured to store machine-readable instructions, wherein when executed, the machine-readable instructions cause the hardware processor system to perform operations comprising:

illuminating a product test substrate with radiation from a component, the radiation comprising one or more predetermined values of a characteristic of the radiation, wherein:

the product test substrate does not comprise a device pattern etched therein and yields a non-zero sensitivity when illuminated at the one or more predetermined values of the characteristic of the radiation, the non-zero sensitivity represents a slope of a swing curve for the product test substrate indicating a change in an optical response characteristic of the product test substrate with respect to a change in the characteristic of the radiation, and the slope of the swing curve is higher at the one or more predetermined values of the characteristic of the radiation than at other values of the characteristic of the radiation;

measuring at least a part of the radiation redirected by the product test substrate to determine a parameter value; and taking an action with respect to the component based on the parameter value.

24. A system comprising:

a metrology apparatus configured to provide a beam of radiation onto an object surface and to detect radiation redirected by the structure on the object surface; and a computer program product comprising a computer non-transitory readable medium having instructions recorded thereon, the instructions when executed by a computer implementing operations comprising:

illuminating a product test substrate with radiation from a component, the radiation comprising one or more predetermined values of a characteristic of the radiation, wherein:

the product test substrate does not comprise a device pattern etched therein and yields a non-zero sensitivity when illuminated at the one or more predetermined values of the characteristic of the radiation, the non-zero sensitivity represents a slope of a swing curve for the product test substrate indicating a change in an optical response characteristic of the product test substrate with respect to a change in the characteristic of the radiation, and the slope of the swing curve is higher at the one or more predetermined values of the characteristic of the radiation than at other values of the characteristic of the radiation;

measuring at least a part of the radiation redirected by the product test substrate to determine a parameter value; and taking an action with respect to the component based on the parameter value.

25. The system of claim 24, further comprising:

a lithographic apparatus comprising a support structure configured to hold a patterning device to modulate a radiation beam; and a projection optical system arranged to project the modulated radiation beam onto a radiation-sensitive substrate, wherein the object is the substrate.

* * * * *